United States Patent
Nagase et al.

(10) Patent No.: US 6,879,942 B1
(45) Date of Patent: Apr. 12, 2005

(54) APPARATUS FOR CALCULATING IMMUNITY FROM RADIATED ELECTROMAGNETIC FIELD, METHOD FOR ACHIEVING CALCULATION, AND STORAGE MEDIUM STORING PROGRAMS THEREFOR

(75) Inventors: Kenji Nagase, Kawasaki (JP); Shinichi Ohtsu, Kawasaki (JP); Makoto Mukai, Kawasaki (JP); Takeshi Kishimoto, Kawasaki (JP); Sekiji Nishino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/282,425

(22) Filed: Mar. 31, 1999

(30) Foreign Application Priority Data

Apr. 7, 1998 (JP) .......................................... 10-094157

(51) Int. Cl.[7] .............................. G06F 17/10; G06F 7/60
(52) U.S. Cl. ................................ 703/2; 703/5; 703/13; 703/14; 716/3
(58) Field of Search ............................... 703/2, 13, 14, 703/5; 716/3

(56) References Cited

U.S. PATENT DOCUMENTS

| | | | | |
|---|---|---|---|---|
| 5,745,370 A | * | 4/1998 | Ohtsu et al. | ................ 455/67.3 |
| 5,887,186 A | * | 3/1999 | Nakanishi | .................... 712/28 |
| 5,903,477 A | * | 5/1999 | Otsu et al. | ..................... 703/13 |
| 6,175,815 B1 | * | 1/2001 | Stalzer | ........................... 703/4 |
| 6,285,957 B1 | * | 9/2001 | Tanaka et al. | .............. 345/168 |

FOREIGN PATENT DOCUMENTS

| EP | 0 778 533 | | 6/1997 | | |
|---|---|---|---|---|---|
| EP | 0778533 A2 | * | 11/1997 | ........... | G06F/17/13 |
| JP | 9-196986 | | 7/1997 | | |

OTHER PUBLICATIONS

Wang et al., "A Frequency Extrapolation Algorithm for FISC", IEEE Transactions on Antennas and Propagation, vol. 45, Issue 12, Dec. 1997, pp. 1891–1893.*
K. Homma, K. Nagase, M. Noro, P. E. Strazdines, T. Yamagajo, Frequency Interpolation Methods for Accelerating Parallel EMC Analysis, IEEE, Aug. 2001, 1632–1635.*
E. Michielssen, A. Boag, "Reduced Representation of Matrices Generated by the Method of Moments," IEEE, Mar. 1994, pp. 420–423.*
F. Canning, "The Impedance Matrix Localization (IML) Method for Mement–Method Calculations", IEEE Antennas and Propagation magazine, Oct. 1990, pp. 18–30.*

\* cited by examiner

Primary Examiner—Kevin J. Teska
Assistant Examiner—Herng-der Day
(74) Attorney, Agent, or Firm—Staas & Halsey LLP

(57) ABSTRACT

An apparatus for calculating immunity from a radiated electromagnetic field which makes possible high-speed simulation of the electric current flowing through an electronic apparatus due to a radio wave radiated from an antenna, and a method and a storage medium storing programs used for the same which divides a radio wave radiated from an antenna into a carrier wave, upper sideband wave, and lower sideband wave, and uses the moment method to simulate the effect of the radio wave on an electronic apparatus by calculating the mutual impedance for one frequency component out of the above three frequency components and using that mutual impedance to solve the simultaneous equations under the moment method so as to calculate the electric current flowing through the electronic apparatus.

53 Claims, 18 Drawing Sheets

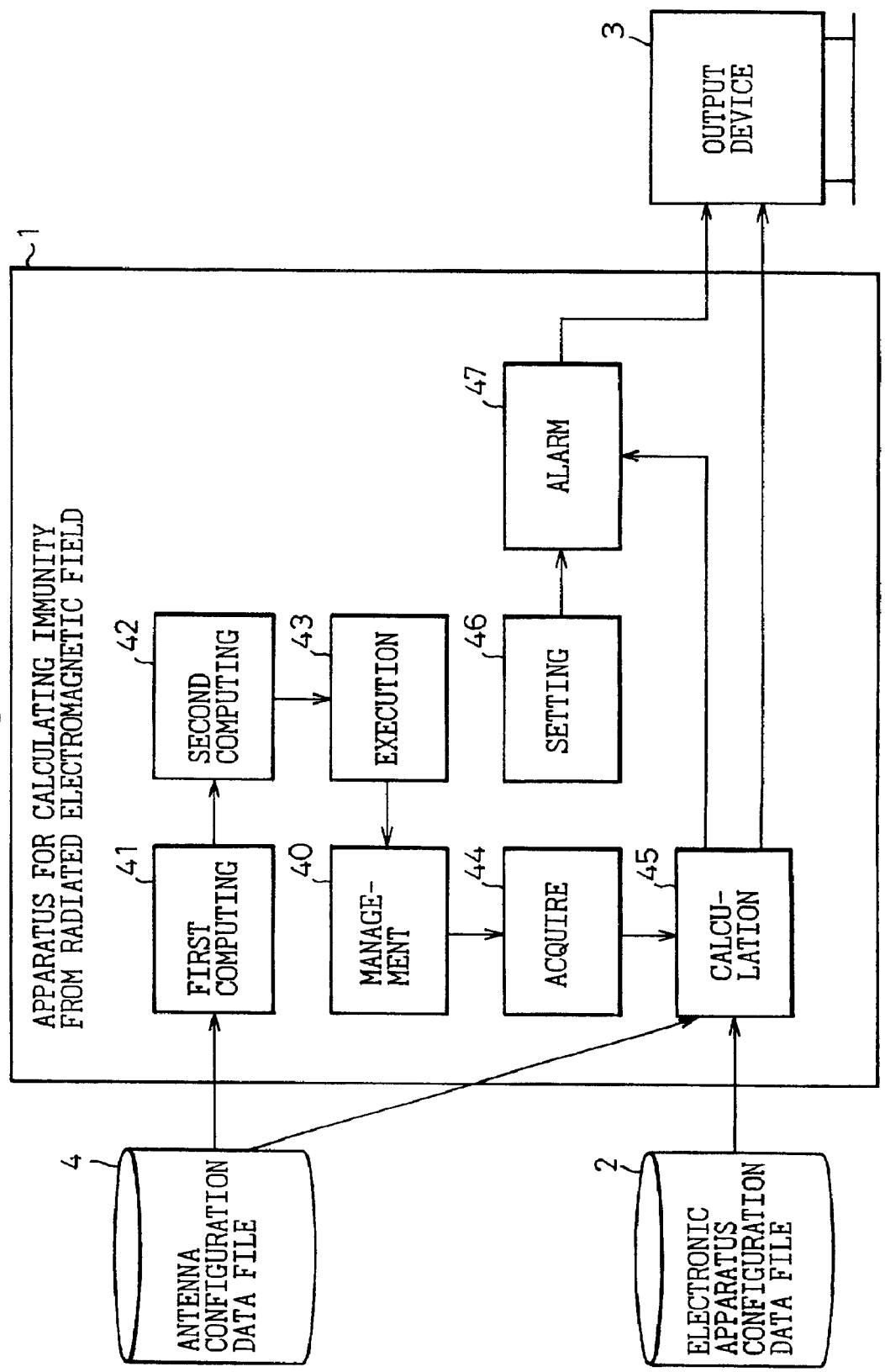

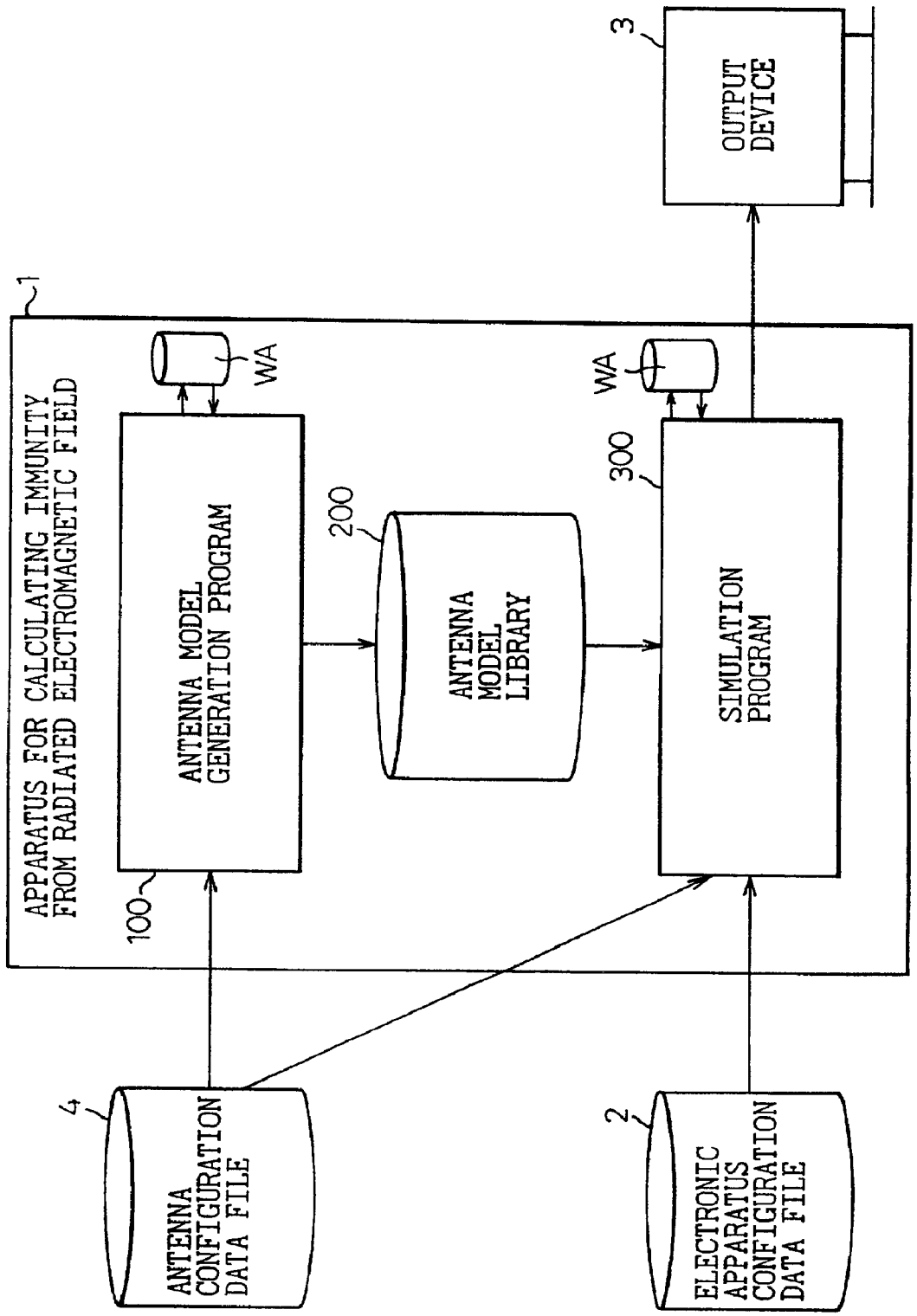

Fig. 5

| ID | CLASS OF ANTENNA | DISTANCE | HEIGHT | MODULATION CONDITION | DIRECTION TO BE APPLIED | ALLOWABLE LEVEL | LOCATION OF UNIFORM ELECTRIC FIELD |
|---|---|---|---|---|---|---|---|
| A1 | aaaaaa | L1 | H1 | M1 | X1 | Y1 | Z1 |
| A2 | bbbbbb | L2 | H2 | M2 | X2 | Y2 | Z2 |
| . | . | . | . | . | . | . | . |
| . | . | . | . | . | . | . | . |
| . | . | . | . | . | . | . | . |

Fig.12A (PRIOR ART)

$$Z = j\omega \int_s [ \frac{\mu}{4\pi} J_1 J_2 \cos\phi \frac{e^{-jkr}}{r}$$

$$+ \frac{1}{4\pi\varepsilon} \rho_1 \rho_2 \frac{e^{-jkr}}{r} ]ds$$

Fig.12B (PRIOR ART)

$$Z_{13} = \frac{j\omega\mu}{4\pi \sin kd_1 \sin kd_3} \int_{t_0}^{t_1}\int_{z_0}^{z_1} [\sin k(z-z_0)\sin k(t-t_0)\cos\phi_1$$

$$-\cos k(z-z_0)\cos k(t-t_0)] \frac{e^{-jkr}}{r} dzdt$$

$$Z_{14} = \frac{j\omega\mu}{4\pi \sin kd_1 \sin kd_4} \int_{t_1}^{t_2}\int_{z_0}^{z_1} [\sin k(z-z_0)\sin k(-t+t_2)\cos\phi_2$$

$$+\cos k(z-z_0)\cos k(-t+t_2)] \frac{e^{-jkr}}{r} dzdt$$

Fig.13 (PRIOR ART)

$$\begin{bmatrix} Z_{11} & Z_{12} & Z_{13} & \cdots & Z_{1N} \\ Z_{21} & Z_{22} & Z_{23} & \cdots & Z_{2N} \\ Z_{31} & Z_{32} & Z_{33} & \cdots & Z_{3N} \\ \vdots & \vdots & \vdots & & \vdots \\ Z_{m1} & Z_{m2} & Z_{m3} & \cdots & Z_{mN} \\ \vdots & \vdots & \vdots & & \vdots \\ Z_{N1} & Z_{N2} & Z_{N3} & \cdots & Z_{NN} \end{bmatrix} \begin{bmatrix} I_1 \\ I_2 \\ I_3 \\ \vdots \\ I_m \\ \vdots \\ I_N \end{bmatrix} = \begin{bmatrix} V_1 \\ V_2 \\ V_3 \\ \vdots \\ V_m \\ \vdots \\ V_N \end{bmatrix}$$

MUTUAL IMPEDANCE    ELECTRIC CURRENT    WAVE SOURCE

N: NUMBER OF ELEMENTS

Fig. 15A (PRIOR ART)

$$I_p(Z_{pp}+R) + I_{p1}Z_{pp1} + I_{p2}Z_{pp2} + \sum_{n=1}^{M} I_n Z_{pn} = 0$$

Fig. 15B (PRIOR ART)

$$I_p = \frac{-1}{Z_{pp}+R} [I_{p1}Z_{pp1} + I_{p2}Z_{pp2} + \sum_{n=1}^{M} I_n Z_{pn}]$$

Fig. 15C (PRIOR ART)

$$V_p = I_p R = \frac{-R}{Z_{pp}+R} [I_{p1}Z_{pp1} + I_{p2}Z_{pp2} + \sum_{n=1}^{M} I_n Z_{pn}]$$

Fig.18 (PRIOR ART)

$$\begin{bmatrix} Z^o{}_{c,c} & Z^o{}_{c,d} & B^o{}_{c,d} \\ Z^o{}_{d,c} & Z^o{}_{d,d}+Z^d{}_{d,d} & B^o{}_{d,d}+B^d{}_{d,d} \\ B^o{}_{d,c} & B^o{}_{d,d}+B^d{}_{d,d} & -Y^o{}_{d,d}-Y^d{}_{d,d} \end{bmatrix} \begin{bmatrix} I_{c,n} \\ I_{d,n} \\ M_n \end{bmatrix} = \begin{bmatrix} V_i \\ 0 \\ 0 \end{bmatrix}$$

US 6,879,942 B1

APPARATUS FOR CALCULATING IMMUNITY FROM RADIATED ELECTROMAGNETIC FIELD, METHOD FOR ACHIEVING CALCULATION, AND STORAGE MEDIUM STORING PROGRAMS THEREFOR

BACKGROUND OF THE INVENTION

1. Field of the Invention

The present invention relates to an apparatus and method for calculating immunity from a radiated electromagnetic field which make possible high speed simulation of an electric current flowing through an electronic apparatus due to a radio wave radiated from an antenna and to a storage medium storing programs used for the same.

One of the new requirements being imposed by society on electronic apparatuses is that they not be affected by radio waves of under a certain level radiated from other electronic apparatuses. Tough regulations on this have been established in the major countries of the world.

Under radio wave regulations, examinations are conducted to determine if electronic apparatuses are affected by radio waves radiated from antennas. This has made necessary the development of technology for simulation of the effect of radio waves radiated from antennas on electronic apparatuses.

2. Description of the Related Art

The electric current and magnetic current flowing through parts of an object can be theoretically found by solving Maxwell's electromagnetic equations under given boundary conditions.

As a method of solving this, there is the moment method. The moment method is one of the methods of solving integration equations derived from Maxwell's electromagnetic equations by segmenting an object into small elements and therefore is able to handle any three-dimensionally shaped object. As a reference on the moment method, there is "H. N. Wang, J. H. Richmond, and M. C. Gilreath: "Sinusoidal reaction formulation for radiation and scattering from conducting surface", IEEE TRANSACTIONS ANTENNAS PROPAGATION, vol. AP-23, 1975".

The electric current and magnetic current flowing through elements are found by segmenting the configuration of an apparatus to be simulated into meshes, selecting a frequency to be processed, finding the mutual impedance, mutual admittance, and mutual reaction among the mesh-like elements for the selected frequency by performing predetermined computations, substituting the found mutual impedance etc. and a wave source specified by the configuration information into simultaneous equations under the moment method, and solving those equations.

That is, when handling a metal object, the metal portion is segmented into meshes as the object of analysis, the mutual impedance Z (value at frequency being processed) among mesh-like metal elements is found, and the simultaneous equations of the moment method standing among the mutual impedance $Z_{ij}$, a wave source $V_i$ of that frequency component, and an electric current $I_i$ of that frequency component flowing through the meshed metal elements:

$$[Z_{ij}][I_i]=[V_i]$$

where, [ ] indicates a matrix are solved to find the electric current $I_i$ flowing through the metal elements.

Note that the mutual impedance shows the relationship between the electric field induced by the electric current flowing through an element and the electric current flowing through another element. The mutual admittance becomes necessary when considering the existence of a dielectric and shows the relationship between a magnetic field induced by a magnetic current passing through one element and the magnetic current passing through another element. The mutual reaction becomes necessary when considering the existence of a dielectric and shows the relationship between the electric field (magnetic field) induced by an electric current (magnetic current) flowing through one element and the magnetic current (electric current) passing through another element. An electric current flows through metal, while an electric current and magnetic current flow on the surface of the dielectric.

Up until the present time, the fact is that no technology for simulation of the effect of a radio wave radiated from an antenna on an electronic apparatus had been developed.

It has however now become possible to simulate the effect of a radio wave radiated from an antenna on an electronic apparatus by using the moment method.

That is, the electronic apparatus to be simulated and the antenna radiating the radio wave are set as a single object for application of the moment method, this is segmented into elements, and the mutual impedance etc. among elements are found by predetermined computations. The mutual impedance etc. found and wave sources specified by the configuration information (wave source of electronic apparatus and wave source of antenna) are substituted into the simultaneous equations of the moment method and the equations are solved so as to find the electric current and magnetic current flowing through the electronic apparatus. Therefore, it has become possible to simulate the effect of a radio wave radiated from an antenna on an electronic apparatus.

In view of this, the present inventors disclosed in Japanese Patent Application No. 9-90412, corresponding to U.S. Ser. No. 08/803,166 and German Patent Application No. 9710787.0, the use of the moment method to simulate the effect of a radio wave radiated from an antenna on an electronic apparatus.

In this invention, note was taken of the fact that if the frequency of the carrier wave is $f_c$ and the frequency of the modulation wave is $f_m$, when amplitude modulation is applied, the frequency of the radio wave radiated from an antenna can be broken down into three parts, that is, $f_c$, $(f_c+f_m)$, and $(f_c-f_m)$ and the moment method is applied by setting the electronic apparatus to be simulated and the antenna radiating the radio wave as a single object for application of the moment method, where the moment method is applied to these above three wave sources. Thus is becomes possible to simulate the effect of the radio wave radiated from an antenna on the electronic apparatus.

It is true that it is possible to simulate the effects of a radio wave radiated from an antenna on an electronic apparatus according to the invention of Japanese Patent Application No. 9-90412.

According to Japanese Patent Application No. 9-90412, however, it is necessary to calculate the mutual impedance, mutual admittance, and mutual reaction and solve simultaneous equations under the moment method for the frequency $f_c$, to calculate the mutual impedance, mutual admittance, and mutual reaction and solve simultaneous equations under the moment method for the frequency $(f_c+f_a)$, and to calculate the mutual impedance, mutual admittance, and mutual reaction and solve simultaneous equations under the moment method for the frequency $(f_c+f_m)$.

This calculation of the mutual impedance, mutual admittance, and mutual reaction, however, takes an extremely long time. Due to this, there is the problem that high speed simulation of the effect of a radio wave radiated from an antenna on an electronic apparatus is not possible using the invention of Japanese Patent Application No. 9-90412.

Note that in the invention of Japanese Patent Application No. 9-90412, the present inventors mainly disclosed technology for simulation of an electric current, magnetic current, and intensity of an electromagnetic field in the time domain using the method of high speed calculation of the mutual impedance, mutual admittance, and mutual reaction disclosed in Japanese Unexamined Patent Publication (Kokai) No. 9-196986 (Japanese Patent Application No. 7-298062).

Further, to simulate the effect of a radio wave radiated from an antenna on an electronic apparatus, it is necessary that the intensity of the electric field applied to the electronic apparatus satisfy local legal requirements.

Japanese Patent Application No. 9-90412 does not consider this point, however. When using the invention of Japanese Patent Application No. 9-90412 to simulate the effect of a radio wave radiated from an antenna on an electronic apparatus, it is necessary to change the positions of the antenna and electronic apparatus on a trial and error basis for the simulation. There will therefore be the problem that high speed simulation of the effect of a radio wave radiated from an antenna on an electronic apparatus will not be possible.

SUMMARY OF THE INVENTION

The present invention was made in consideration of this situation. An object of the present invention is to provide a novel apparatus and method for calculating immunity from a radiated electromagnetic field which make possible high speed simulation of the electric current flowing through an electronic apparatus due to a radio wave radiated from an antenna and to provide a storage medium storing programs used for the same.

To attain the above object, the present invention divides a radio wave radiated from an antenna into a carrier wave, upper sideband wave, and lower sideband wave and uses the moment method to simulate the effect of the radio wave on an electronic apparatus. It calculates the mutual impedance for just one frequency component out of the above three frequency components and uses the calculated mutual impedance to solve the simultaneous equations under the moment method so as to calculate the electric current flowing through the electronic apparatus and uses that mutual impedance to solve the simultaneous equations under the moment method for one frequency among them, while ignoring the wave source of the electronic apparatus, so as to calculate the electric current of that frequency component flowing through the electronic apparatus and calculates the electric currents of the remaining frequency components by a proportional operation. By this, it is able to calculate the electric current flowing through the electronic apparatus due to a radio wave radiated from an antenna. As a result, it is possible to realize an apparatus for calculating immunity from a radiated electromagnetic field which makes possible high speed simulation of the electric current flowing through an electronic apparatus due to a radio wave radiated from an antenna.

BRIEF DESCRIPTION OF THE DRAWINGS

The above object and features of the present invention will be more apparent from the following description of the preferred embodiments with reference to the accompanying drawings, wherein:

FIG. 2 is another view of the basic configuration of the present invention;

FIG. 3 is a view of an embodiment of the present invention;

FIG. 5 is a view explaining an antenna model;

FIGS. 12A and 12B are other views explaining the method of calculation of the mutual impedance;

FIG. 13 is a view explaining simultaneous equations under the moment method;

FIGS. 15A, 15B and 15C are other views explaining the voltage between conductors;

FIG. 18 is a view explaining simultaneous equations under the moment method.

DESCRIPTION OF THE PREFERRED EMBODIMENTS

Preferred embodiments of the present invention will be described next with reference to the related figures.

FIGS. 1A, 1B, and 1C and FIG. 2 show the basic configuration of the present invention.

In the figure, 1 is an apparatus for calculating immunity from a radiated electromagnetic field to which the present invention is applied. The apparatus simulates the electric current flowing through an electronic apparatus due to a radio wave radiated from an antenna.

The apparatus 1 for calculating immunity from a radiated electromagnetic field reads the configuration information of the electronic apparatus to be simulated from an electronic apparatus configuration data file 2 and segments the electronic apparatus and the antenna used for the simulation (whose configuration information is read from an antenna configuration data file 4 shown in FIG. 2) into elements. Explaining the case where to consideration is given to a dielectric, the mutual impedance among elements is calculated and simultaneous equations under the moment method defining the relationship among the mutual impedance, wave sources, and electric currents flowing through elements are solved so as to simulate the electric current flowing through an electronic apparatus due to a radio wave radiated by an antenna. The results of that simulation are output to an output device 3.

Figure 1A:
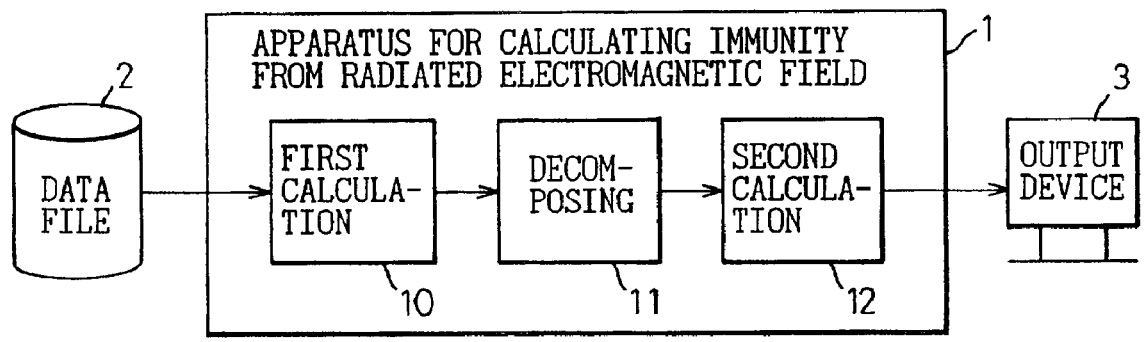
FIGS. 1A, 1B and 1C are views of the basic configuration of the present invention.

The apparatus 1 for calculating immunity from a radiated electromagnetic field of the present invention of the basic configuration shown in FIG. 1A is provided with a first calculating means 10, a decomposing means 11, and a second calculating means 12.

The first calculating means 10 sets a representative frequency (for example, the carrier wave) with respect to the carrier wave frequency, upper sideband frequency and lower sideband frequency of the radio wave radiated by an antenna and calculates the mutual impedance among elements at that representative frequency.

The decomposing means 11 applies LU decomposition or LDU decomposition to the matrix of the mutual impedance calculated by the first calculating means 10.

The second calculating means 12 solves the simultaneous equations under the moment method having the mutual impedance calculated by the first calculating means 10 for the carrier wave frequency, upper sideband frequency and lower sideband frequency so as to calculate the electric current flowing through the electronic apparatus due to a radio wave radiated by an antenna.

When considering a dielectric, the mutual admittance and mutual reaction among elements at the representative frequency are calculated in addition to the mutual impedance and simultaneous equations under the moment method considering a dielectric having the mutual impedance, mutual admittance and mutual reaction are solved.

The functions of the apparatus 1 for calculating immunity from a radiated electromagnetic field of the present invention of the basic configuration illustrated in FIG. 1A are more specifically realized by programs. The programs are stored in a floppy disk or other medium, stored in the disk etc. of a server etc., and installed, from these disks etc., in the apparatus 1 for calculating immunity from a radiated electromagnetic field and operated in a memory for realization of the present invention.

In the apparatus 1 for calculating immunity from a radiated electromagnetic field of the present invention of the basic configuration illustrated in FIG. 1A, the first calculating means 10 sets a representative frequency taking into consideration the fact that there is only a slight difference among the carrier wave frequency, upper sideband frequency and lower sideband frequency forming a radio wave radiated by an antenna. It then calculates the mutual impedance among elements at that representative frequency to calculate the mutual impedance common to these frequencies.

Receiving this mutual impedance, the second calculating means 12 solves the simultaneous equations under the moment method having the calculated mutual impedance for the carrier wave frequency, upper sideband frequency and lower sideband frequency to calculate the electric current flowing through the electronic apparatus due to a radio wave radiated by an antenna.

At this time, when the decomposing means 11 is provided, the second calculating means 12 uses the LU decomposed or LDU decomposed matrix of the mutual impedance to solve the moment method. LU decomposition or LDU decomposition take time, but it is possible to solve the moment method at a high speed by using an LU decomposed or LDU decomposed matrix of the mutual impedance. In total, therefore, it become possible to solve simultaneous equations under the moment method at a high speed.

In this way, in the apparatus 1 for calculating immunity from a radiated electromagnetic field of the present invention of the basic configuration shown in FIG. 1A, when configured to break down a radio wave radiated by an antenna into a carrier wave, upper sideband wave and lower sideband wave and use the moment method to simulate the effect of the radio wave radiated by an antenna, the mutual impedance is calculated for just one frequency component among the carrier wave frequency, upper sideband frequency and lower sideband frequency, the calculated mutual impedance is used to solve the simultaneous equations under the moment method for the carrier wave frequency so as to calculate the electric current of the carrier wave frequency component flowing through the electronic apparatus due to a radio wave radiated by an antenna, to solve the simultaneous equations under the moment method for the upper sideband frequency so as to calculate the electric current of the upper sideband frequency component flowing through the electronic apparatus due to a radio wave radiated by an antenna, and to solve the simultaneous equations under the moment method for the lower sideband frequency so as to calculate the electric current of the lower sideband frequency component flowing through the electronic apparatus due to a radio wave radiated by an antenna. Therefore, it is possible to simulate the current flowing through the electric current due to a radio wave radiated by an antenna at a high speed.

Figure 1B:
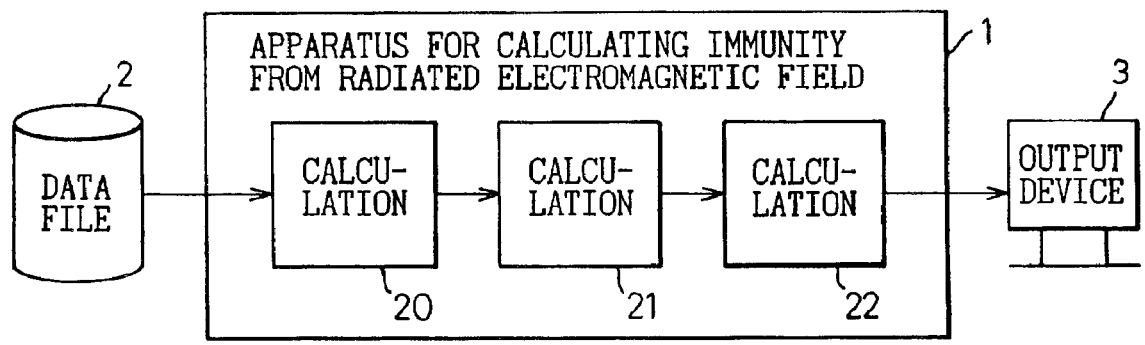

The apparatus 1 for calculating immunity from a radiated electromagnetic field of the present invention of the basic configuration shown in FIG. 1B is provided with a first calculating means 20, a second calculating means 21, and a third calculating means 22.

The first calculating means 20 sets a representative frequency out of the carrier wave frequency, upper sideband frequency, and lower sideband frequency forming a radio wave radiated by an antenna and calculates the mutual impedance among elements at that representative frequency.

The second calculating means 21 solves the simultaneous equations under this moment method having the mutual impedance calculated by the first calculating means 20 for one of the carrier wave frequency, upper sideband frequency and lower sideband frequency, while ignoring the wave source of the electronic apparatus, so as to calculate the electric current flowing through the electronic apparatus due to a radio wave radiated from an antenna.

The third calculating means 22 calculates the electric currents, other than the electric current calculated by the second calculating means 21, flowing through the electronic apparatus due to a radio wave radiated from an antenna, by a proportional operation, by using the electric current calculated by the second calculating means 21 and the value of the wave source of the antenna.

When considering a dielectric, the mutual admittance and mutual reaction among elements at the representative frequency are calculated in addition to the mutual impedance and simultaneous equations under the moment method, considering a dielectric having the mutual impedance, mutual admittance and mutual reaction, are solved.

The functions of the apparatus 1 for calculating immunity from a radiated electromagnetic field of the present invention of the basic configuration illustrated in FIG. 1B are more specifically realized by programs. The programs are stored in a floppy disk or other medium, stored in the disk etc. of a server etc., and installed, from these disks etc., in the apparatus 1 for calculating immunity from a radiated electromagnetic field 4 and operated in a memory for realization of the present invention.

In the apparatus 1 for calculating immunity from a radiated electromagnetic field of the present invention of the basic configuration illustrated in FIG. 1B, the first calculating means 20 sets a representative frequency taking into consideration the fact that there is only a slight difference among the carrier wave frequency, upper sideband frequency and lower sideband frequency forming a radio wave radiated by an antenna. It then calculates the mutual impedance among elements at that representative frequency to calculate the mutual impedance common to these frequencies.

Receiving this mutual impedance, explaining the case where the second calculating means 21 uses the carrier wave frequency in its calculations, the second calculating means 21 solves the simultaneous equations under the moment method for the carrier wave frequency having the calculated mutual impedance, while ignoring the wave source of the electronic apparatus, to calculate the electric current of the carrier wave frequency component flowing through the electronic apparatus due to a radio wave radiated by an antenna.

Receiving the electric current of the carrier wave frequency component calculated by the second calculating means 21, the third calculating means 22 calculates the electric current of the upper sideband frequency component flowing through the electronic apparatus due to a radio wave radiated by an antenna, by a proportional operation, by using the calculated electric current of the carrier wave frequency component, the value of the wave source of the antenna at the carrier wave frequency and the value of the wave source of the antenna at the upper side band frequency and also calculates the electric current of the lower sideband frequency component flowing through the electronic apparatus due to a radio wave radiated by an antenna, by a proportional operation, by using the calculated electric current of the carrier wave frequency component, the value of the wave source of the antenna at the carrier wave frequency and the value of the wave source of the antenna at the lower sideband frequency.

In this way, in the apparatus 1 for calculating immunity from a radiated electromagnetic field of the present invention of the basic configuration shown in FIG. 1B, when configured to break down a radio wave radiated by an antenna into a carrier wave, upper sideband wave and lower sideband wave and use the moment method to simulate the effect of a radio wave radiated by an antenna, the mutual impedance is calculated just one frequency component among the above three frequencies, the calculated mutual impedance is used to solve the simultaneous equations under the moment method for one of the frequencies among these, while ignoring the wave source of the electronic apparatus, so as to calculate the electric current of that frequency component flowing through the electronic apparatus, and the electric currents of the remaining frequency components are calculated by a proportional operation, so it is possible to simulate the current flowing through the electronic apparatus due to a radio wave radiated by an antenna at a high-speed.

Figure 1C:
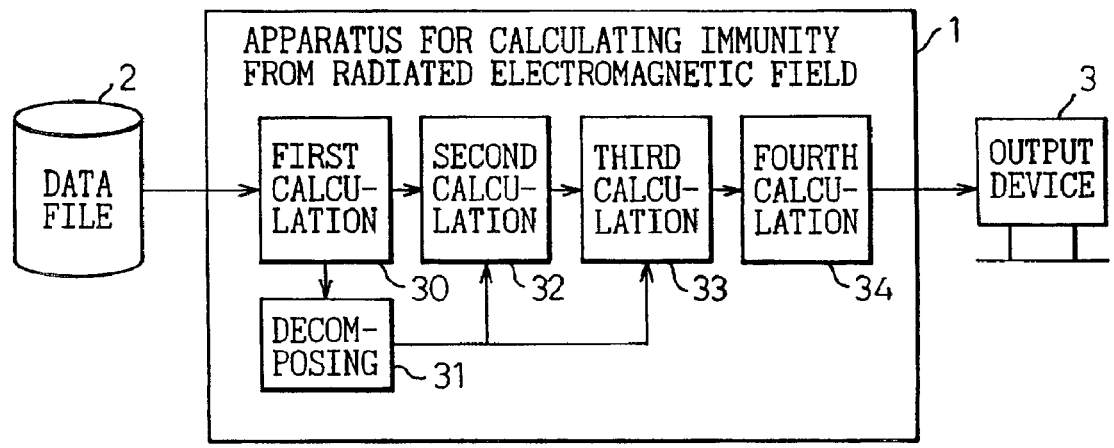

The apparatus 1 for calculating immunity from a radiated electromagnetic field of the present invention of the basic configuration shown in FIG. 1C is provided with a first calculating means 30, a decomposing means 31, a second calculating means 32, a third calculating means 33, and a fourth calculating means 34.

The first calculating means 30 sets a representative frequency out of the carrier wave frequency, upper sideband frequency and lower sideband frequency forming a radio wave radiated by an antenna and calculates the mutual impedance among elements at that representative frequency.

The decomposing means 31 applies LU decomposition or LDU decomposition on the matrix of the mutual impedance calculated by the first calculating means 30.

The second calculating means 32 solves the simultaneous equations under the moment method having the mutual impedance calculated by the first calculating means 30 for the frequency, among the carrier wave frequency, upper sideband frequency and lower sideband frequency which overlaps the frequency, including a higher harmonic component, of the wave source of the electronic apparatus, so as to calculate the electric current flowing through the electronic apparatus due to a radio wave radiated by an antenna.

The third calculating means 33 solves the simultaneous equations under the moment method having the mutual impedance calculated by the first calculating means 30 for one of the frequencies not used in the calculation by the second calculating means 32 so as to calculate the electric current, other than the electric current calculated by the second calculating means 32, flowing through the electronic apparatus due to a radio wave radiated from an antenna.

The fourth calculating means 34 calculates the electric current, other than the electric currents calculated by the second and third calculating means 32 and 33, flowing through an electronic apparatus due to a radio wave radiated from an antenna, by a proportional operation, by using the electric current calculated by the third calculating means 33 and the value of the wave source of the antenna.

When considering a dielectric, the mutual admittance and mutual reaction among elements at the representative frequency are calculated in addition to the mutual impedance and simultaneous equations under the moment method having the mutual impedance, mutual admittance and mutual reaction, considering a dielectric, are solved.

The functions of the apparatus 1 for calculating immunity from a radiated electromagnetic field of the present invention of the basic configuration illustrated in FIG. 1C are more specifically realized by programs. The programs are stored in a floppy disk or other medium, stored in the disk etc. of a server etc., and installed, from these disk etc., in the apparatus 1 for calculating immunity from a radiated electromagnetic field and operated in a memory for realization of the present invention.

In the apparatus 1 for calculating immunity from a radiated electromagnetic field of the present invention of the basic configuration illustrated in FIG. 1C, the first calculating means 30 sets a representative frequency taking into consideration the fact that there is only a slight difference among the carrier wave frequency, upper sideband frequency and lower sideband frequency forming a radio wave radiated by an antenna. It then calculates the mutual impedance among elements at that representative frequency to calculate the mutual impedance common to these frequencies.

Receiving this mutual impedance, explaining the case where the carrier wave frequency overlaps the frequency of the wave source of the electronic apparatus and the upper sideband frequency and lower sideband frequency do not overlap the frequency of the wave source of the electronic apparatus, the second calculating means 32 solves the simultaneous equations under the moment method having the calculated mutual impedance (wave source of electronic apparatus is considered), for the carrier wave frequency, to calculate the electric current of the carrier wave frequency component flowing through the electronic apparatus due to a radio wave radiated by an antenna, while the third calculating means 33 solves the simultaneous equations under the moment method having the calculated mutual impedance (wave source of electronic apparatus is not considered), for example for the upper sideband frequency, to calculate the electric current of for example the upper sideband frequency component flowing through the electronic apparatus due to a radio wave radiated by an antenna.

Receiving the electric current of the upper sideband frequency component calculated by the third calculating means 33, the fourth calculating means 34 calculates the electric current of the lower sideband frequency component flowing through the electronic apparatus due to a radio wave radiated from an antenna, by a proportional operation, by using the calculated electric current of the upper sideband frequency component, the value of the wave source of the antenna at the upper sideband frequency and the value of the wave source of the antenna at the lower sideband frequency.

At this time, when the decomposing means 31 is provided, the second and third calculating means 32 and 33 solve the simultaneous equations of the moment method using the LU decomposed or LDU decomposed matrix of the mutual impedance. LU decomposition and LDU decomposition take time, but it is possible to solve the simultaneous equations under the moment method using a LU decomposed or LDU decomposed matrix of mutual impedance at a high speed. In total, therefore, it becomes possible to solve the simultaneous equations under the moment method at a high speed.

In this way, in the apparatus 1 for calculating immunity from a radiated electromagnetic field of the present invention of the basic configuration shown in FIG. 1C, when configured to break down a radio wave radiated by an antenna into a carrier wave, upper sideband wave and lower sideband wave and use the moment method to simulate the effect of a radio wave radiated by an antenna, the mutual impedance is calculated for just one frequency component among the above three frequencies, the calculated mutual impedance is used to solve the simultaneous equations under the moment method for the frequency overlapping the frequency of the wave source of the electronic apparatus so as to calculate the electric current of that frequency component flowing through the electronic apparatus, the simultaneous equations under the moment method are solved for just one of the electric currents of the non-overlapping frequency components to calculate the electric current of that frequency component flowing through the electronic apparatus, and the electric current of the remaining frequency component is calculated by a proportional operation, so it is possible to simulate the current flowing through the electric current due to the radio wave radiated by an antenna at a high speed.

The apparatus 1 for calculating immunity from a radiated electromagnetic field of the present invention of the basic configuration shown in FIG. 2 is provided with a managing means 40, a first computing means 41, a second computing means 42, an executing means 41, an acquiring means 44, a calculating means 45, a setting means 46, and an alarm means 47.

The managing means 40 manages antenna information realizing a prescribed intensity of an electric field on an electronic apparatus (intensity of electric field prescribed in regulations etc.)

The first computing means 41 assumes a state where there is no electronic apparatus, segments the antenna to be registered in the managing means 40 into elements, calculates the mutual impedance among these elements, and solves the simultaneous equations under the moment method defining the relationship among the calculated mutual impedance, wave source of the antenna and electric currents flowing through the elements so as to calculate the electric currents flowing through these antenna elements. In this calculation processing, the first computing means 41 solves the simultaneous equations under the moment method for one frequency among the carrier wave frequency, upper sideband frequency and lower sideband frequency so as to calculate the electric current flowing through the antenna.

The second computing means 42 calculates the intensity of the electric field which the electric current calculated by the first computing means 41 causes in the electronic apparatus at different locations of installation.

The executing means 43 changes the distance between the antenna and electronic apparatus and the value of the wave source of the antenna to determine the specific distance and value of the wave source giving the prescribed intensity of electric field calculated by the second computing means 42 and registers the thus prescribed antenna information in the managing means 40.

The acquiring means 44 acquires an antenna model for use in the simulation from the managing means 40 when a simulation request is issued.

The calculating means 45 segments the electronic apparatus and the antenna designated by the antenna information acquired by the acquiring means 44 into elements, calculates the mutual impedance among these elements, and solves the simultaneous equations under the moment method defining the relationship among the calculated mutual impedance, wave source and electric currents flowing through the elements so as to calculate the electric current flowing through the electronic apparatus due to a radio wave radiated by an antenna. In this calculation processing, the calculating means 45 can calculate the electric current using the high speed calculation techniques executed by the apparatuses 1 for calculating immunity from a radiated electromagnetic field of the present invention of the basic configurations shown in FIGS. 1A to 1C.

The setting means 46 sets a threshold current for a specified element and sets a threshold voltage for a position between specified conductor elements.

The alarm means 47 outputs information on whether the electric current flowing through a specified element exceeds a threshold current set by the setting means 46 and outputs information on whether the voltage generated at a position between specified conductor elements exceeds a threshold voltage set by the setting means 46.

When considering a dielectric, the mutual admittance and mutual reaction among elements are calculated in addition to the mutual impedance and simultaneous equations under the moment method having the mutual impedance, mutual admittance and mutual reaction, considering a dielectric, are solved.

The functions of the apparatus 1 for calculating immunity from a radiated electromagnetic field of the present invention of the basic configuration illustrated in FIG. 2 are more specifically realized by programs. The programs are stored in a floppy disk or other medium, stored in the disk etc. of a server etc., and installed, from these disks etc., in the apparatus 1 for calculating immunity from a radiated electromagnetic field and operated in a memory for realization of the present invention.

In the apparatus 1 for calculating immunity from a radiated electromagnetic field of the present invention of the basic configuration illustrated in FIG. 2, when the first computing means 41 assumes a state where there is no electronic apparatus to calculate the electric currents flowing through elements of the antenna, the second computing means 42 calculates the intensity of the electric field caused by the calculated electric current in the electronic apparatus at different locations of installation.

Receiving the calculation processing of the second computing means 42, the executing means 43 changes the distance between the antenna and electronic apparatus and the value of the wave source of the antenna to determine the specific distance and value of the wave source giving the prescribed intensity of electric field calculates by the second computing means 42 and registers the thus prescribed antenna information in the managing means 40.

Receiving the antenna information managed by the managing means 40, the acquiring means 44 acquires antenna information for use in the simulation from the managing means 40 when a simulation request is issued. Receiving this, the calculating means 45 segments the electronic apparatus to be simulated and the antenna designated by the antenna information (FIG. 5) acquired by the acquiring means 44 into elements calculates the mutual impedance among these elements, and solves the simultaneous equations under the moment method defining the relationship among the calculated mutual impedance, wave source and electric currents flowing through the elements so as to calculate the electric current flowing through the electronic apparatus due to a radio wave radiated by an antenna.

At this time, the alarm means 47 compares the electric current, flowing through a specified element, calculated by the calculating means 45 and the threshold current set by the setting means 46 and outputs information on whether the electric current exceeds the threshold current. Further, the alarm means 47 compares (i) the voltage generated at a position between specified conductor elements, derived by making the voltage generated across a resistor, virtually inserted between the conductors, one obtained if the resistor has an infinitely large resistance, and (ii) the threshold voltage set by the setting means 46 and outputs information on whether this voltage exceeds the threshold voltage.

In this way, in the apparatus 1 for calculating immunity from a radiated electromagnetic field of the present invention of the basic configuration shown in FIG. 2, when configured to use the moment method to simulate the effect of a radio wave radiated by an antenna, antenna information for realizing a prescribed intensity of an electric field on the electronic apparatus (intensity of electric field prescribed in regulations etc.) is prepared in advance and the antenna information is used to solve the simultaneous equations under the moment method so as to calculate the electric current flowing through the electronic apparatus when there is a simulation request, so it is possible to simulate at a high speed the electric current flowing through the electronic apparatus when a prescribed intensity of electric field is applied due to a radio wave radiated by an antenna.

The present invention will be explained in further detail below in accordance with specific embodiments.

FIG. 3 is a view of an embodiment of the apparatus 1 for calculating immunity from a radiated electromagnetic field of the present invention.

The apparatus 1 for calculating immunity from a radiated electromagnetic field of the present invention according to this embodiment is provided with an electronic apparatus configuration data file 2 for managing information on the configurations of electronic apparatuses to be simulated, an output device 3 for outputting the results of the simulation, an antenna configuration data file 4 for managing information on the configurations of antennas used for the processing in the simulation, an antenna model generation program 100, installed through a floppy disk or through a line etc., for reading the configuration information of an antenna from the antenna configuration data file 4 and generating an antenna model used for the processing in the simulation, an antenna model library 200 for managing the antenna models generated by the antenna model generation program 100, and a simulation program 300, installed through a floppy disk or through a line etc., for reading the configuration information of an electronic apparatus to be simulated from the electronic apparatus configuration data file 2, simulating the electric current flowing through the electronic apparatus due to a radio wave radiated by an antenna, and outputting the result of the simulation to the output device 3.

Figure 4:
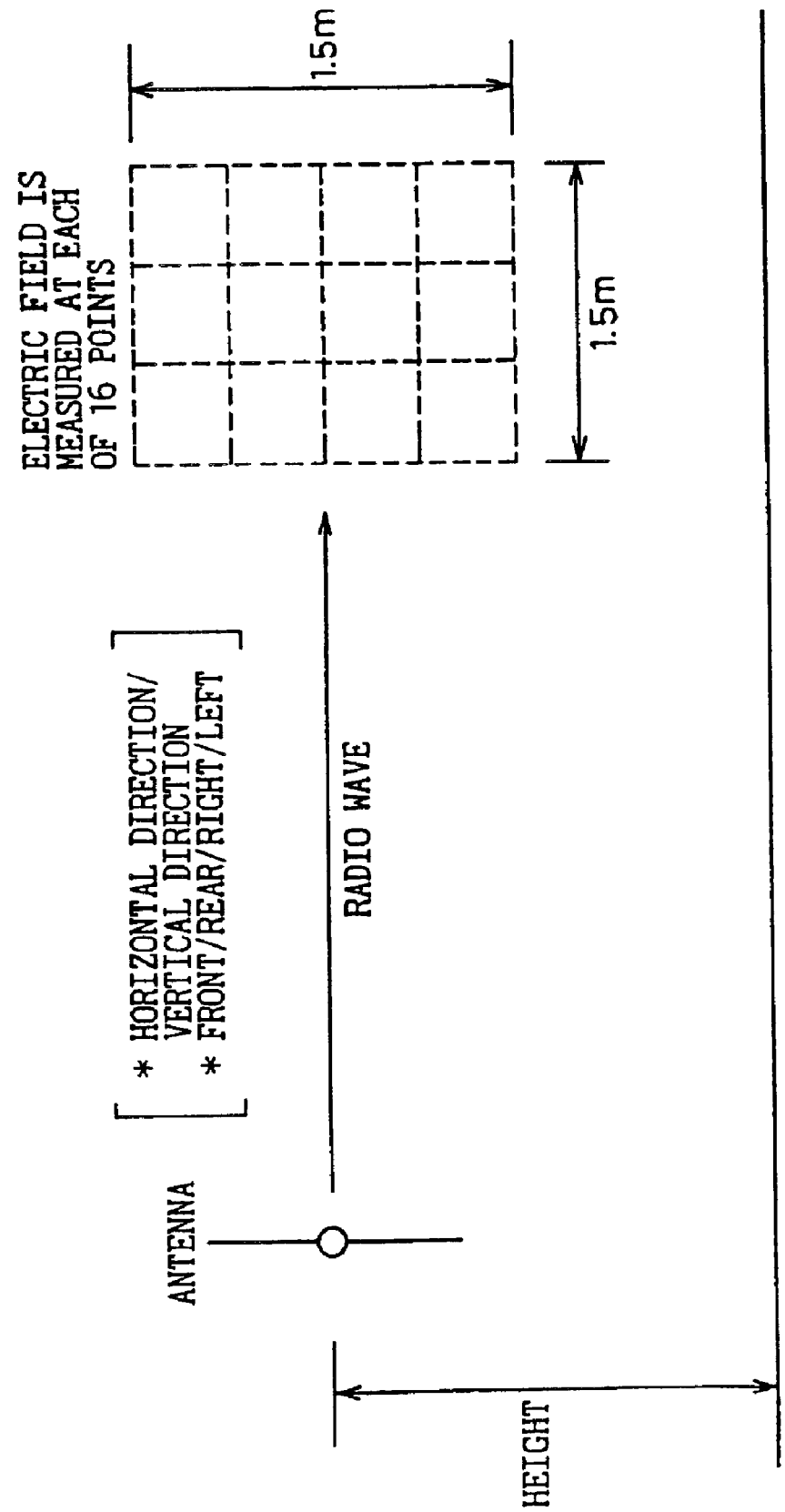
FIG. 4 is a view explaining the test regulations.

A test for examining the effect of a radio wave radiated by an antenna on an electronic apparatus is performed, as shown in FIG. 4, by establishing a testing zone having a size of for example 1.5 m×1.5 m in which an electronic apparatus is arranged at a position of a certain height from the ground (set in a state perpendicular to the ground as shown in the figure) and applying an electric field of a prescribed magnitude to the testing zone by a radio wave radiated by an antenna (for example, an electric field of 3V/m with a difference between the maximum value and minimum value of not more than 6 dB).

The antenna model generation program 100 generates an antenna model realizing the test conditions. Specifically, as shown in FIG. 5, it generates an antenna model comprised of a configuration ID (specifying the antenna configuration information stored in the antenna configuration data file 4), the class of the antenna (dipole, Log-Peri, biconical, etc.), the distance between the antenna and the electronic apparatus, the height of the antenna, the modulation condition of the antenna, the direction in which the electric field is to be applied from the antenna (horizontal direction/ vertical direction, front/rear/right/left), the allowable level of the intensity of the electric field in the testing zone (above-mentioned 6 dB, 3V/m), and the location of the uniform electric field plane of the testing zone (above-mentioned 1.5 m×1.5 m).

Here, the modulation conditions of the antenna specifically consist of information (condition) on the frequency range of the carrier wave, the frequency $f_c$ of the carrier wave, the frequency $f_m$ of the modulation wave, and whether the modulation is amplitude modulation or pulse modulation.

The radio wave radiated by an antenna, if the modulation signal is v(t), becomes:

$$f(t)=A_0[1+kv(t)]\exp(j\omega_c t)$$

The modulation signal v(t) is expanded by a complex Fourier series as follows:

$$v(t)=\Sigma c_n \exp(jn\omega_m t) \quad n=0\pm1\pm2\ldots$$

In this equation, in the case of amplitude modulation, "n=1". On the other hand, in the case of pulse modulation, "n=0 to ±∞, but in the simulation processing, "n=0 to ±L" is set. Therefore, $$v(t)=\Sigma c_n \exp(jn\omega_m t) \quad n=0\pm1\ldots\pm L$$

If this is substituted in $$f(t)=A_0[1+kv(t)]\exp(j\omega_c t)$$

the result is, $$f(t)=A_0\exp(j\omega_c t)+A_0 k\Sigma c_n\exp[j(\omega_c+n\omega_m)t]$$

Figure 6A:
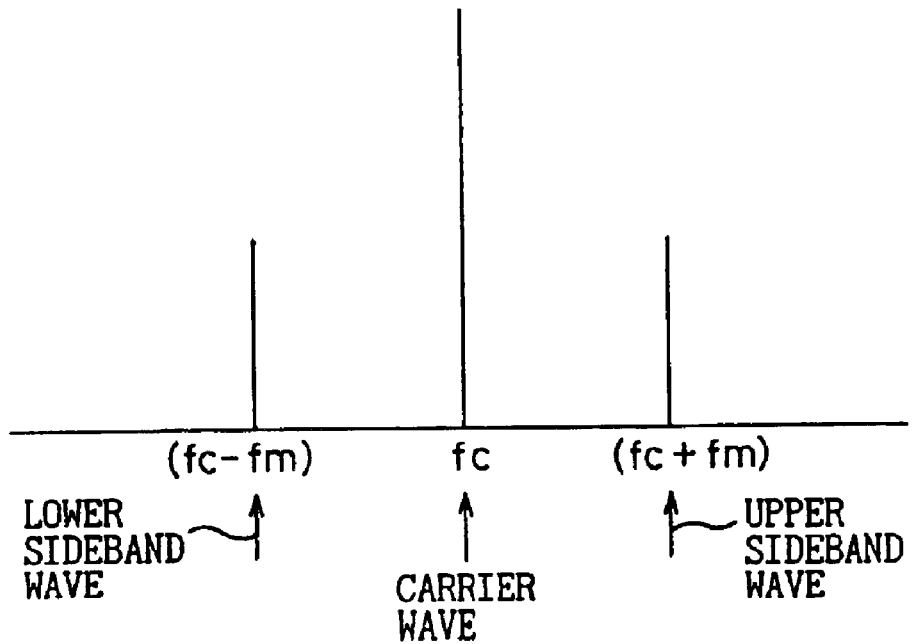
FIGS. 6A and 6B are views explaining a radio wave radiated from an antenna.
Figure 6B:
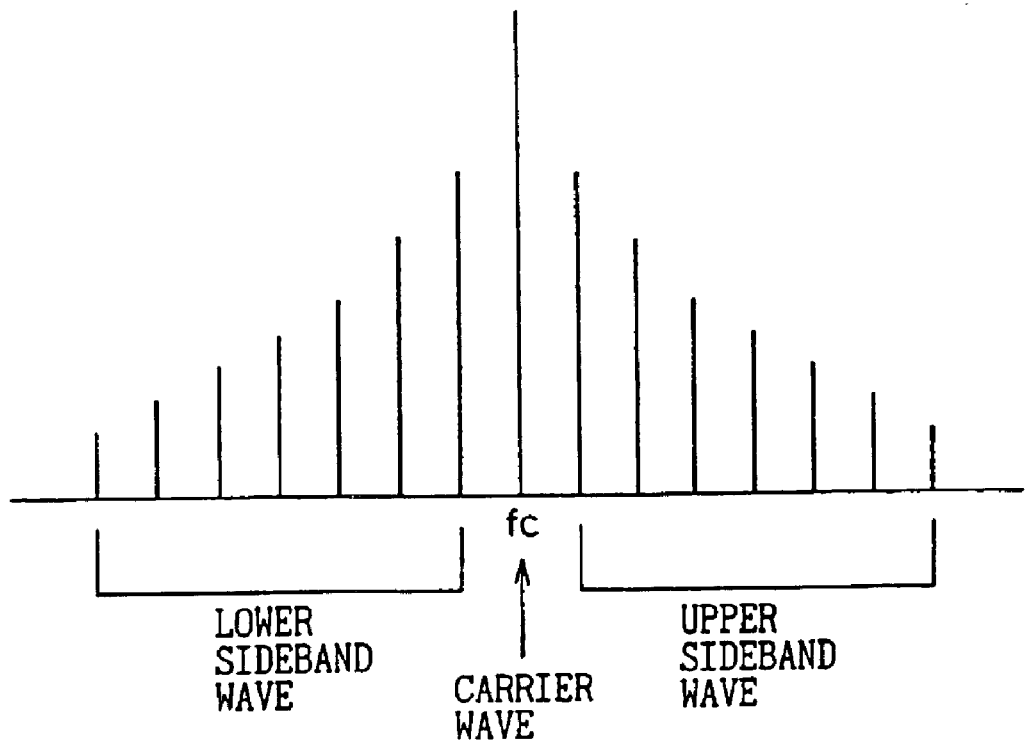

From this, in the case of amplitude modulation, as shown in FIG. 6A, the wave source of the antenna can be broken down into three waves sources, that is, the wave source of the frequency $f_c$ of the carrier wave, the wave source of the frequency $(f_c+f_m)$ of the upper sideband wave and the wave source of the frequency $(f_c-f_m)$ of the lower sideband wave. Further, in the case of pulse modulation, as shown in FIG. 6B, it may be broken down into the three types of wave sources of the wave source of the frequency $f_c$ of the carrier wave, the wave sources of the frequencies increased incrementally by $f_m$ from $f_c$, which become the frequency of the upper sideband wave, and the wave sources of the frequencies decreased incrementally by $f_m$ from $f_c$, which become the frequency of the lower sideband wave.

From this, in the antenna model, information on the frequency range of the carrier wave, the frequency $f_c$ of the carrier wave, the frequency $f_m$ of the modulation wave, and whether the modulation is amplitude modulation or pulse modulation is managed.

Figure 7:
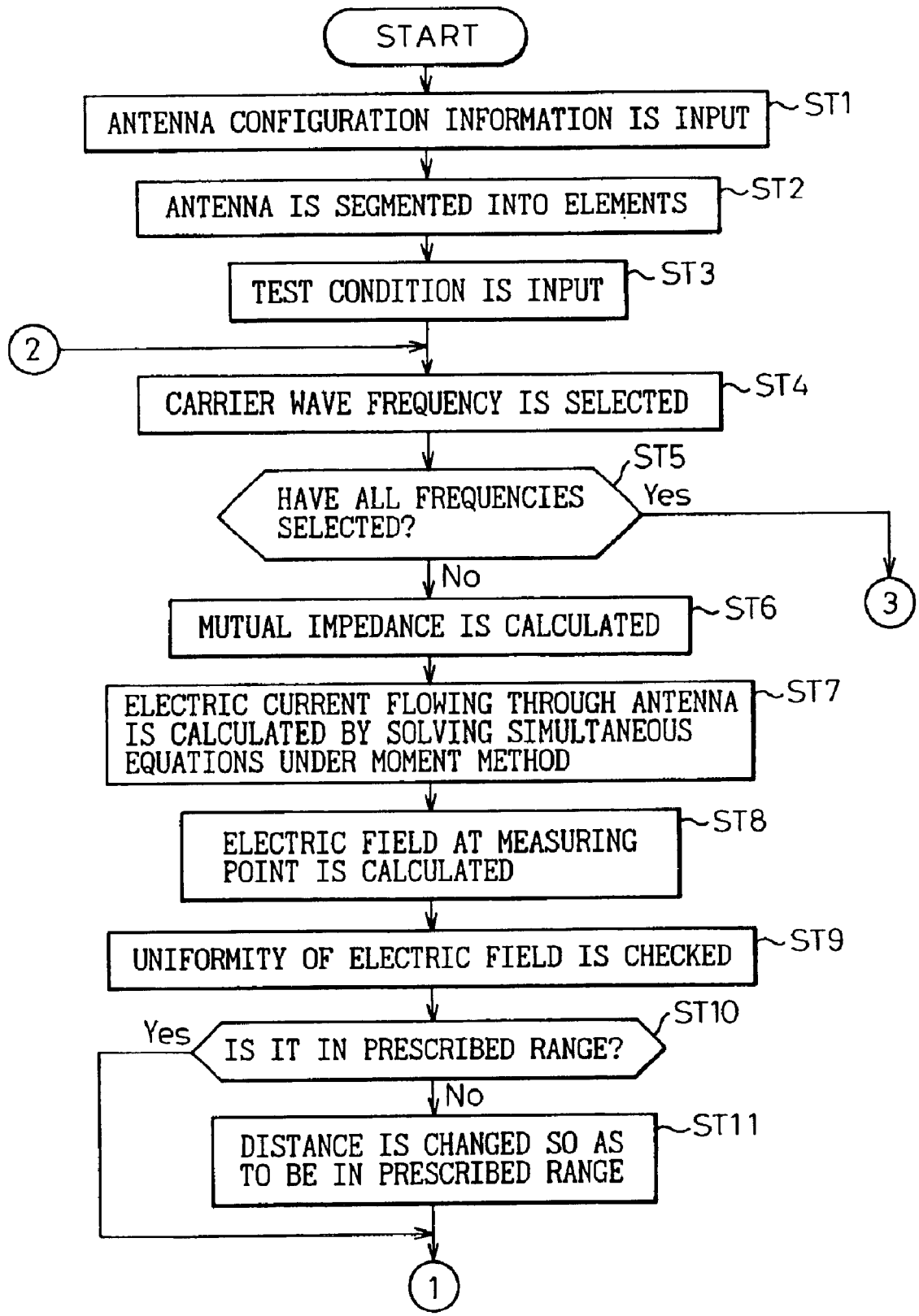
FIG. 7 is a view of the flow of processing of a program for generating an antenna model.
Figure 8A:
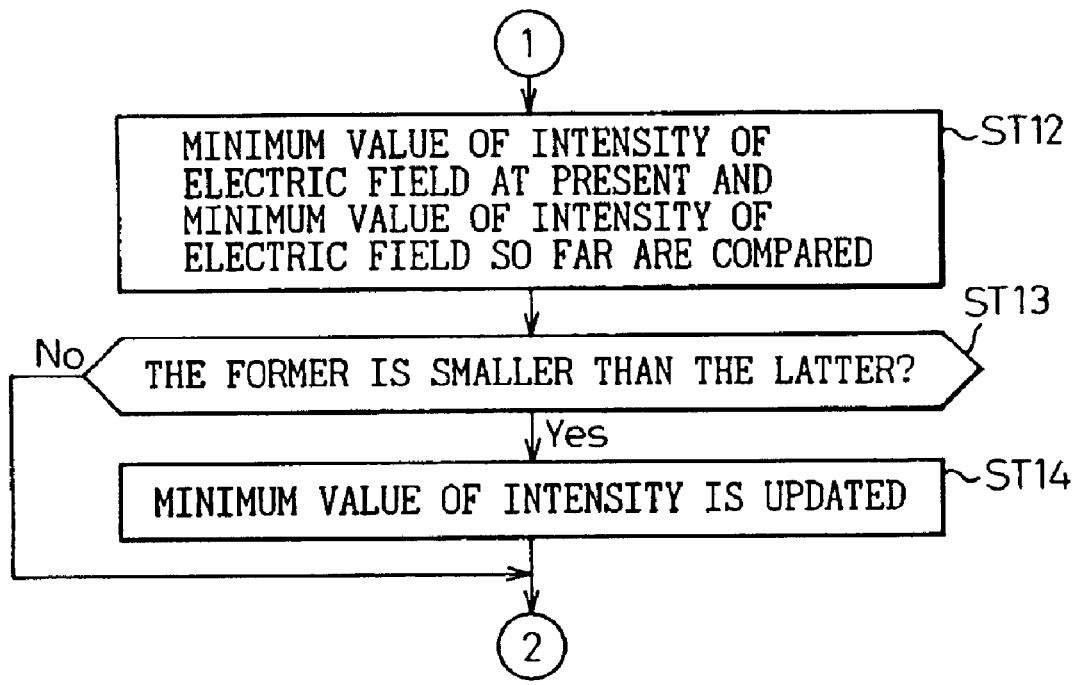
FIGS. 8A and 8B are other views of the flow of processing by a program for generating an antenna model.
Figure 8B:
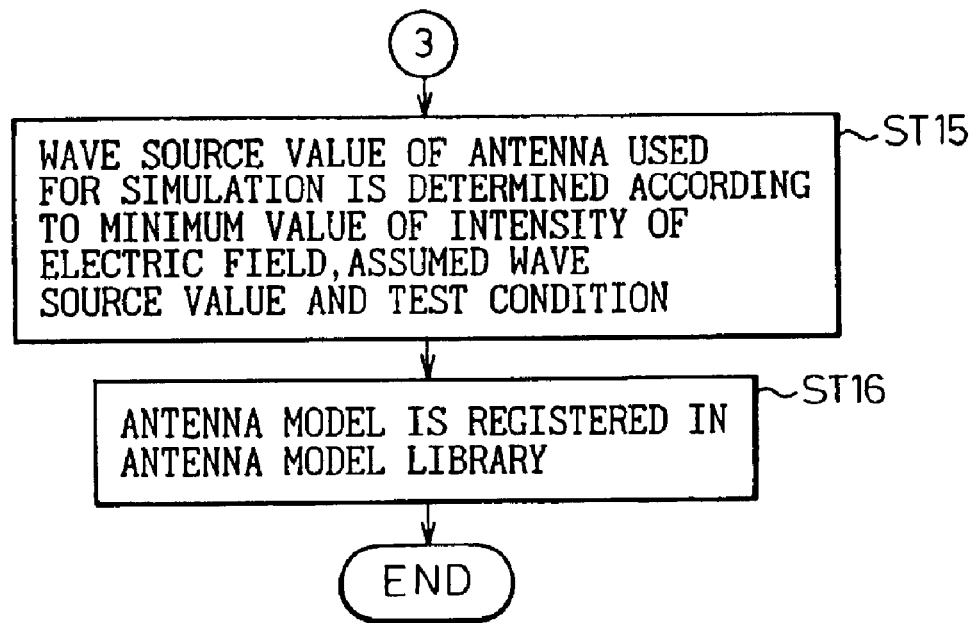
Figure 9:
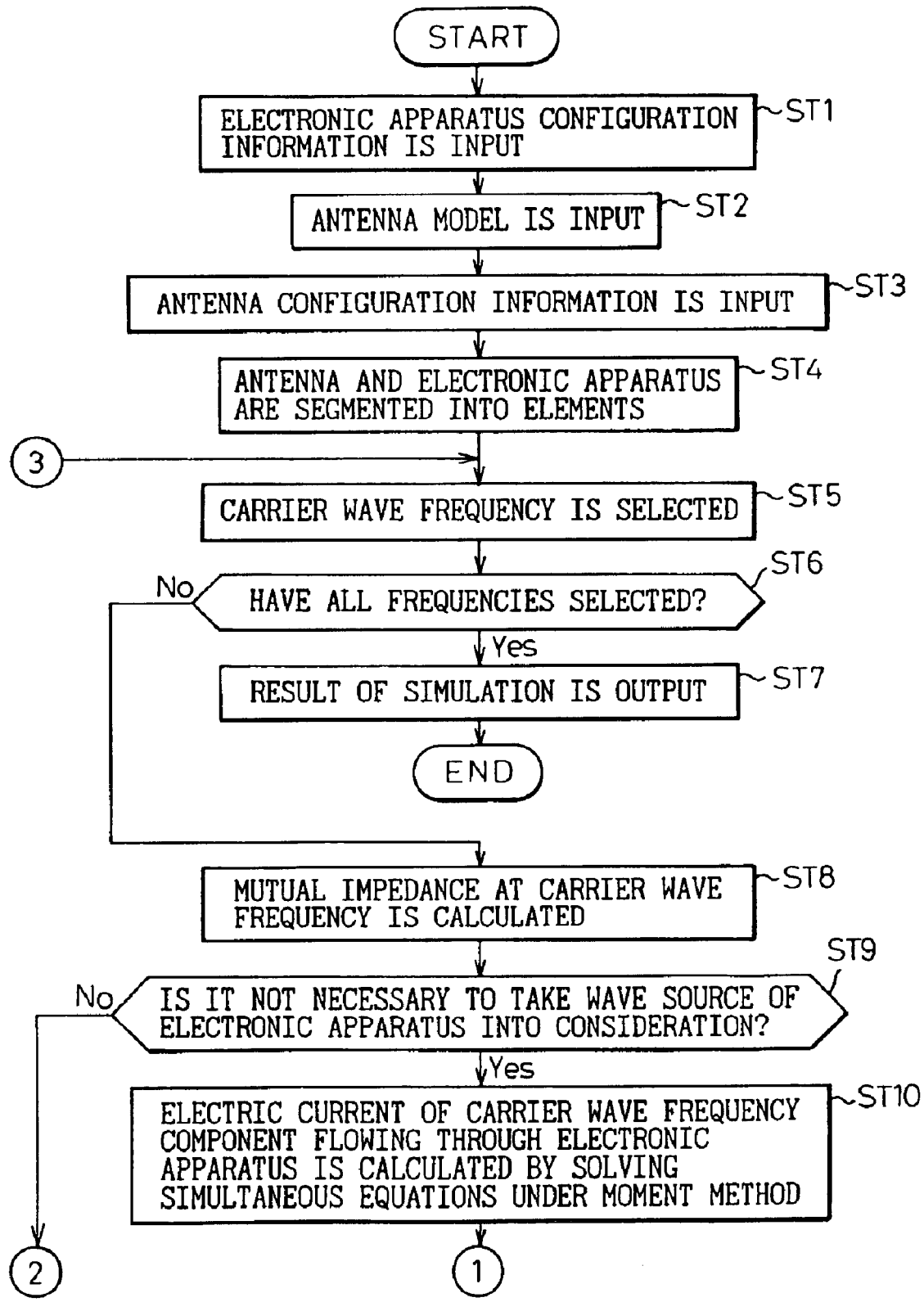
FIG. 9 is a view of the flow of processing by a simulation program.
Figure 10:
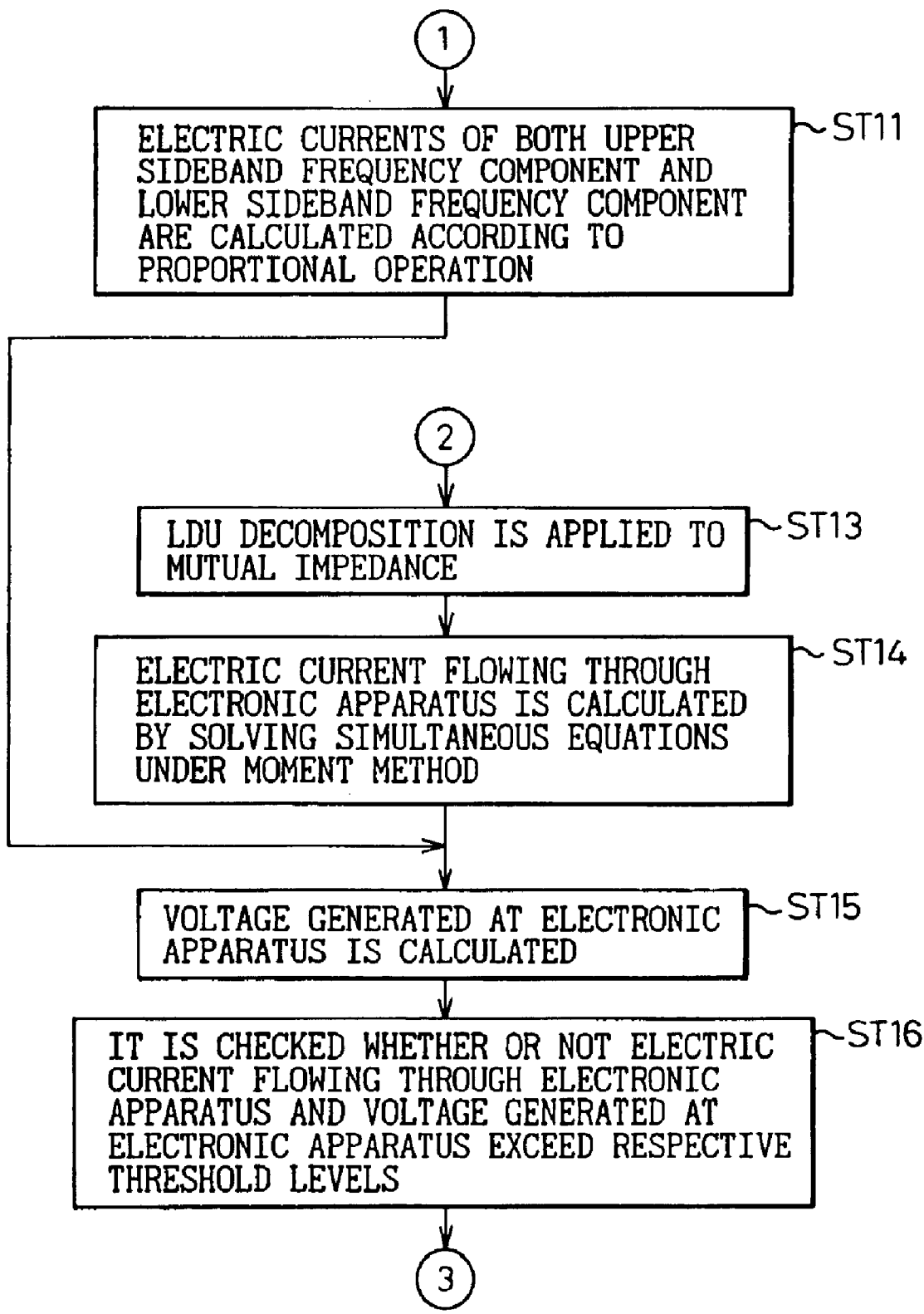
FIG. 10 is another view of the flow of processing by a simulation program.

FIG. 7 and FIGS. 8A and 8B show an embodiment of the flow of processing executed by the antenna model generation program 100, while FIG. 9 and FIG. 10 show an example of the flow of processing executed by the simulation program 300. Next, the present invention will be explained in detail in accordance with these flows of processing.

First, an explanation will be made of the processing executed by the antenna model generation program in accordance with the flow of processing of FIG. 7 and FIGS. 8A and 8B.

When an operator specifies a configuration ID and issues a request for generation of an antenna model, the antenna model generation program 100, as shown in the flow of processing of FIG. 7 and FIGS. 8A and 8B, first, at step (ST) 1, receives as input the configuration information of the antenna indicated by the specified configuration ID from the antenna configuration data file 4, then, at step 2, segments the input antenna to which the simultaneous equations under the moment method are to be applied, into elements.

Next, at step 3, it receives as input the test conditions for the simulation for the antenna through a dialog with the operator. That is, it receives as input the frequency range of the carrier wave from the antenna (for example, 30 MHz to 1 GHz), the frequency of the modulation wave from the antenna (for example, 1 kHz), the modulation mode (amplitude modulation/pulse modulation), the height of the antenna, the direction to be radiated from the antenna, the size of the testing zone (for example, 1.5 m×1.5 m), the allowable level of the intensity of the electric field in the testing zone (for example, 6 dB and 3 V/m), and other information constituting the antenna model.

Here, the distance between the antenna and the testing zone is determined from now so as to realize the input allowable level of the intensity of the wave source of the antenna, so that prescribed initial value is input. At this time, looking at the initial value of the distance between the antenna and testing zone, as will be understood from the later explanation, a small value is set for the distance used in the actual simulation as well.

Next, at step 4, the program selects one carrier wave frequency in a manner increased incrementally for example by 50 MHz from the frequency range of the carrier wave input at step 3. Next, at step 5, it judges if all of the frequencies have finished being selected. When it judges that not all of the frequencies have finished being selected, that is, when it judges that a carrier wave frequency could be selected at step 4, it proceeds to step 6, where it calculates the mutual impedance among elements segmented at step 2 at the selected carrier wave frequency.

Figure 11:
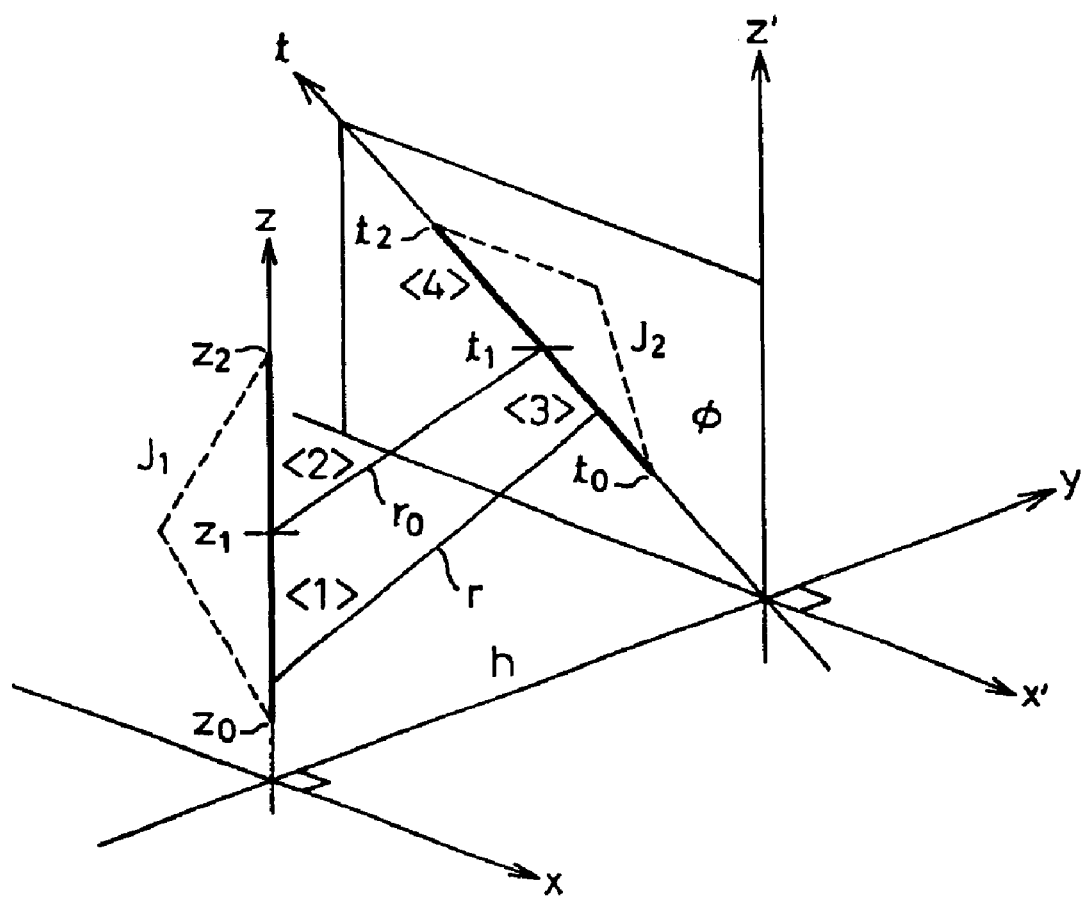
FIG. 11 is a view explaining the method of calculation of the mutual impedance.

The mutual impedance is specifically calculated by assuming the monopoles as shown in FIG. 11 (<1> to <4> in the figure).

The general equation of the mutual impedance $Z_{ij}$ between an element i and an element j is shown by the equation illustrated in FIG. 12A. In the figure, $\omega$ indicates the angular frequency, r the distance between monopoles, $J_1$ and $J_2$ the shapes of distribution of electric current on the monopoles, and $\phi$ the angle between monopoles and $\rho_1=(-1/j\omega)\times[\partial J_1/\partial t]$ and $\rho_2=(-1/j\omega)\times[\partial J_2/\partial t]$.

As the distributions $J_1$, $J_2$ of electric current on the monopoles, assuming that:

Electric current monopole <1> $J_1=\sin k(z-z_0)/\sin kd_1$

Electric current monopole <2> $J_1=\sin k(z_2-z)/\sin kd_2$

Electric current monopole <3> $J_2=\sin k(t-t_0)/\sin kd_3$

Electric current monopole <4> $J_2=\sin k(t_2-t)/\sin kd_4$ where, $d_1$ is the length of the monopole <1>, $d_2$ is the length of the monopole <2>, $d_3$ is the length of the monopole <3>, and $d_4$ is the length of the monopole <4>, the mutual impedance $Z_{13}$ between the monopole <1> and the monopole <3> and the mutual impedance $Z_{14}$ between the monopole <1> and the monopole <4> become as given by the equations illustrated in FIG. 12B. The mutual impedance $Z_{23}$ between the monopole <2> and the monopole <3> and the mutual impedance $Z_{24}$ between the monopole <2> and the monopole <4> are given by similar equations.

Next, at step 6 (FIG. 7), the program computes these equations to find the mutual impedance $Z_{ij}$ ($=Z_{13}+Z_{14}+Z_{23}+Z_{24}$) between the element i and the element j.

When calculating at step 6 the mutual impedance between elements at the carrier wave frequency selected at step 4, the program then solves, at step 7, the simultaneous equations under the moment method, shown by the equation in FIG. 13, having that mutual impedance to as to calculate the electric current flowing through the antenna elements segmented at step 2.

Next, at step 8, the program computes the intensity of the electric field applied by the electric current calculated at step 7 to a plurality of measurement points (for example, 16 points) set in the testing zone and input at step 3. The processing for this calculation is executed in accordance with the known Maxwell's electromagnetic theoretical equations. Next, at step 9, the program specifies the maximum value and minimum value of the intensity of the electric field calculated at step 8 and calculates the difference between these two intensities of electric field to check for the degree of uniformity of the electric field in the testing zone.

Next, at step 10, the program checks if the difference of the intensities of the electric field calculated at step 9 is less than an allowable attenuation ratio (for example, 6 dB) input at step 3. When it is judged by this checking processing that it is not less than the allowable attenuation ratio, the program proceeds to step 11, where it increases the distance between the antenna and testing zone so that the difference becomes less than the allowable attenuation ratio. Note that when increasing the distance, the uniformity of the electric field in the testing zone is improved, so it is not necessary to repeat the checking processing for the carrier wave frequencies for which the check of uniformity of the electric field had been finished up to then.

When judging at step 10 that the difference is less than the allowable attenuation ratio or when judging at step 10 that the difference is not less than the allowable attenuation ratio and changing the distance at step 11 so that the distance becomes less than the allowable attenuation ratio, the program proceeds to step 12 (flow of processing of FIG. 8) where it compares the minimum value of the intensity of the electric field calculated presently at step 8 and the minimum value of the intensity of the electric field calculated in the past (held in the working area (see WA in FIG. 3)).

Next, at step 13, the program judges if the minimum value of the intensity of the electric field currently calculated is smaller than that of the past by the comparison processing at step 12. If judging that it is smaller, the program proceeds to step 14, where it updates the minimum value of the intensity of the electric field held at the above working area, then returns to step 4 for the processing of the next carrier wave frequency. Conversely, if judging that it is larger, the program returns to step 4 for the processing of the next carrier wave frequency without performing the processing of step 14.

By repeating the processings of step 4 to step 14, the distance between the antenna and the testing zone giving a difference within the allowable attenuation ratio (for example, 6 dB) is found. When the distance finishes being determined by judging at step 5 that all of the frequencies have finished being selected, the program proceeds to step 15, where it determines the value of the wave source of the antenna to be used for the simulation by using the minimum value of the intensity of the electric field held in the working area, the value of the wave source of the antenna assumed as the initial value and the intensity of the electric field of the test conditions input at step 3 (for example, 3V/m).

For example, when the intensity of the electric field of the test conditions input at step 3 to 3 V/m and the program assumes the value of the wave source of the antenna to be 1V (originally expressed as a complex number since a phase is involved) to determine the distance between the antenna and the testing zone, when the minimum value of the intensity of the electric field held in the working area is for example 1.5 V/m, the program determines the value of the wave source of the antenna to be used for the simulation to be 2V in accordance with the proportional operation of:

$$1V \times [3 \div 1.5] = 2V$$

Further, finally, at step 16, the program generates an antenna model in accordance with the information of the test conditions input at step 3, the distance between the antenna and testing zone finally determined in accordance with the processing of step 11 and the value of the wave source determined at step 15, registers this in the antenna model library 200, and then ends the processing.

In this way, in accordance with the flow of processing of FIG. 7 and FIGS. 8A and 8B, the antenna model generation program 100 generates an antenna model having the data configuration shown in FIG. 5 and registers this in the antenna model library 200.

In the flow of processing, the antenna model generation program 100 solves the simultaneous equations under the moment method for the carrier wave frequency so as to evaluate the intensity of the electric field applied by the electric current of that frequency component flowing through the antenna and thereby determine the distance between the antenna and testing zone, but it is also possible to solve the simultaneous equations under the moment method for the upper sideband frequency or lower sideband frequency so as to evaluate the intensity of the electric field applied by the electric current of those frequency components flowing through the antenna and determine the distance between the antenna and testing zone.

Next, an explanation will be made of the processing executed by the simulation program 300 in accordance with the flow of processing of FIG. 9 and FIG. 10. Here, in the flow of processing, for convenience in the explanation, amplitude modulation is used. Accordingly, as shown in FIG. 6A, one upper sideband wave and one lower sideband wave are assumed.

When an operator specifies an electronic apparatus for simulation and a configuration ID of an antenna model for use in the simulation and issues a request for simulation, the simulation program 300, as shown by the flow of processing of FIG. 9 and FIG. 10, first, at step (ST) 1, receives as input the configuration information of the electronic apparatus to be simulated from the electronic apparatus configuration data file 2.

Next, at step 2, its receives as input the antenna model indicated by the specified configuration ID from the antenna model library 200, then, at step 3, receives as input the configuration information of the antenna indicated by the specified configuration ID from the antenna configuration data file 4. Next, at step 4, it segments the input electronic apparatus and antenna, to which the simultaneous equations under the moment method are to be applied, into elements.

Next, at step 5, the program selects one carrier wave frequency from the frequency range of the carrier wave specified in the antenna model in a manner increased incrementally for example by 30 MHz. Next, at step 6, it judges if all of the frequencies have finished being selected. When it judges that all of the frequencies have finished being selected, it proceeds to step 7, where it outputs the results of the simulation to the output device 3 and ends the processing.

On the other hand, when it judges at step 6 that not all of the frequencies have finished being selected, that is, when it judges that a carrier wave frequency could be selected at step 5, it proceeds to step 8, where it calculates the mutual impedance among elements segmented at step 4 at the selected carrier wave frequency in accordance with the above calculation technique.

Next, at step 9, the program judges if the wave source of the electronic apparatus to be simulated need not be considered. When judging that it need not be considered, that is, when judging that the frequency, including a higher harmonic component, of the wave source of the electronic apparatus does not overlap the selected carrier wave frequency, or that it overlaps it, but the value of the wave source is small and therefore the wave source can be ignored, the program proceeds to step 10, where it solves the simultaneous equations, for the carrier wave frequency, under the moment method (only wave source of antenna exists) having the mutual impedance calculated at step 8 so as to calculate the electric current of the carrier wave frequency component flowing through the elements of the electronic apparatus segmented at step 4.

Next, the program proceeds to step 11 (flow of processing of FIG. 10) where it calculates the electric current of the upper sideband frequency component flowing through the elements of the electronic apparatus segmented at step 4, in accordance with a proportional operation, by using the electric current of the carrier wave frequency component calculated at step 10, the value of the wave source of the antenna at the carrier wave frequency and the value of the wave source of the antenna at the upper sideband frequency and calculates the electric current of the lower sideband frequency component flowing through the elements of the electronic apparatus segmented at step 4, in accordance with a proportional operation, by using the electric current of the carrier wave frequency component calculated at step 10, the value of the wave source of the antenna at the carrier wave frequency and the value of the wave source of the antenna at the lower sideband frequency.

That is, expressing the electric current of the carrier wave frequency component flowing through the elements of the electronic apparatus calculated at step 10 by $I_C$, the electric current of the upper sideband frequency component flowing through the elements of the electronic apparatus by $I_H$, the electric current of the lower sideband frequency component flowing through the elements of the electronic apparatus by $I_L$, the value $V_C$ of the wave source of the antenna at the carrier wave frequency by "$V_c=a_c+jb_c$", the value $V_H$ of the wave source of the antenna at the upper sideband frequency by "$V_H=a_H+jb_H$", and the value $V_L$ of the wave source of the antenna at the lower sideband frequency by "$V_L=a_L+jb_L$", the electric current of the upper sideband frequency component flowing through the elements of the electronic apparatus is calculated in accordance with the proportional operation as shown below:

$$I_H=I_C\times[(a_H+jb_H)/(a_C+jb_C)]$$

and the electric current of the lower sideband frequency component flowing through the elements of the electronic apparatus is calculated in accordance with the proportional operation as shown below:

$$I_L=I_C\times[(a_L+jb_L)/(a_C+jb_C)]$$

Next, at step 15, the program uses the electric currents found at step 10 and step 11 to calculate the voltage generated at a position between the conductor elements specified by the operator.

The processing for this calculation is executed by calculating the voltage $V_P(f)$ between conductor elements in accordance with:

$$V_P(\omega)=-\Sigma I_n(\omega)Z_{pn}(\omega)$$

where $\Sigma$ is n=1 to M when the position p between conductor elements is specified, the electric current flowing through an element n is indicated by $I_n(\omega)$, and the mutual impedance between the position p, between conductor elements, and the element n is indicated by $Z_{pn}(\omega)$.

Figure 14:
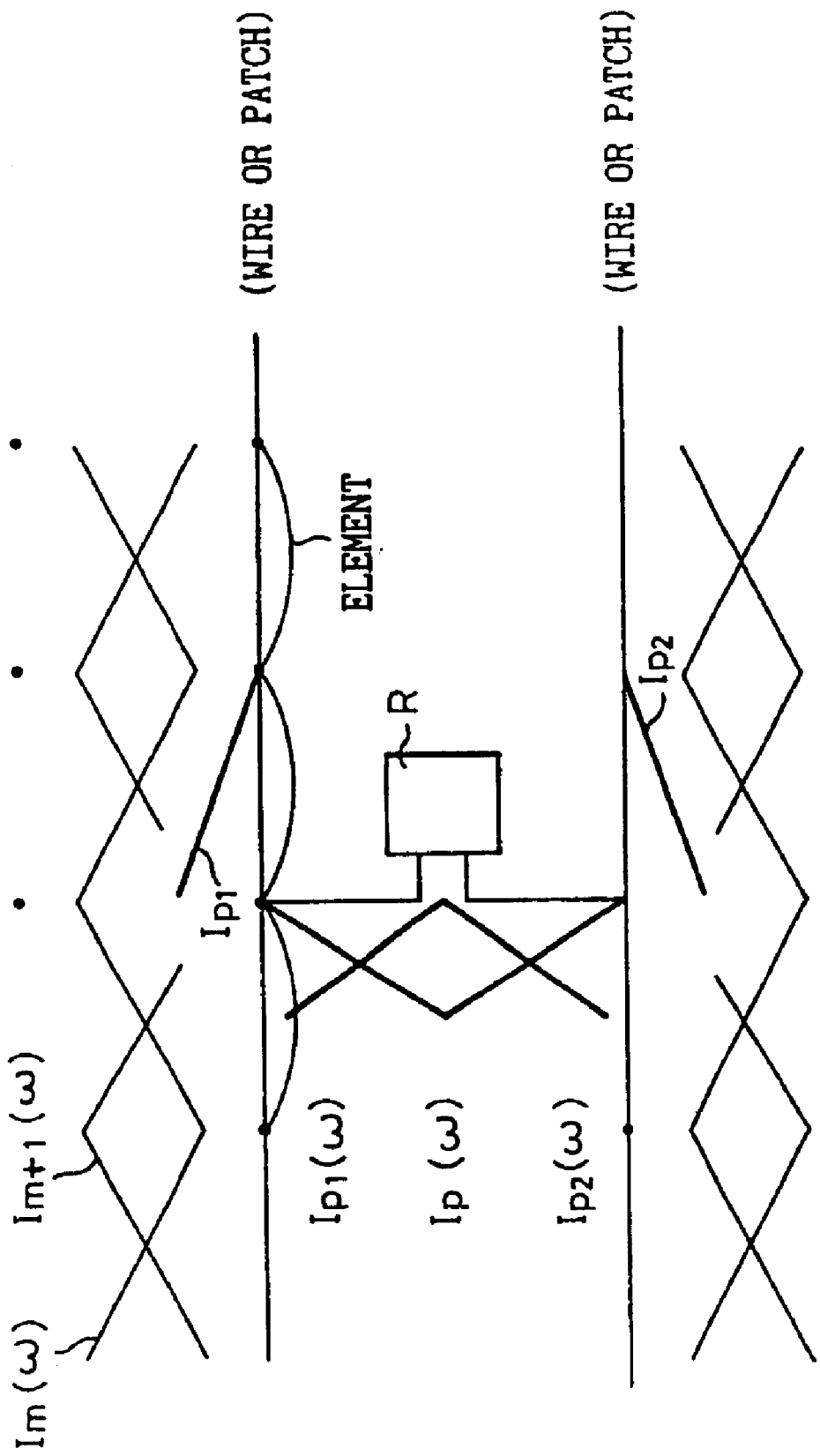
FIG. 14 is a view explaining the voltage between conductors.

Explaining this calculation formula, as shown in FIG. 14, if a resistor R is inserted between the conductor of the conductor element p1 and the conductor element p2, then based on the boundary condition that the electric field on the conductors becoming zero, the equation shown in FIG. 15A stands. From this, the electric current $I_p$ between conductors is found by the equation shown in FIG. 15B and, from this, the voltage $V_P$ between conductors is found by the equation shown in FIG. 15C. In actuality, since no current flows between conductors, in the equation shown in FIG. 15C, "R $\to\infty$, $I_{p1}$, $I_{p2} \to 0$". From this equation (FIG. 15C) is found.

That is, this equation is derived by making the voltage generated across a resistor, virtually inserted between the conductors, one obtained if the resistor has an infinitely large resistance.

At step 15, the program calculates the voltage generated at a position between specified conductor elements. Next, at step 16, it judges if the electric current flowing through an element specified by the operator exceeds a prescribed threshold and if the voltage generated at the position between conductor elements calculated at step 15 exceeds a prescribed threshold, registers the results of its judgement, then returns to step 5 for the processing of the next carrier wave frequency.

Here, the thresholds are set for example through a dialog with the operator such that, if the thresholds are exceeded, there is a possibility of an electronic circuit component positioned at the specified element malfunctioning due to noise.

Figure 16:
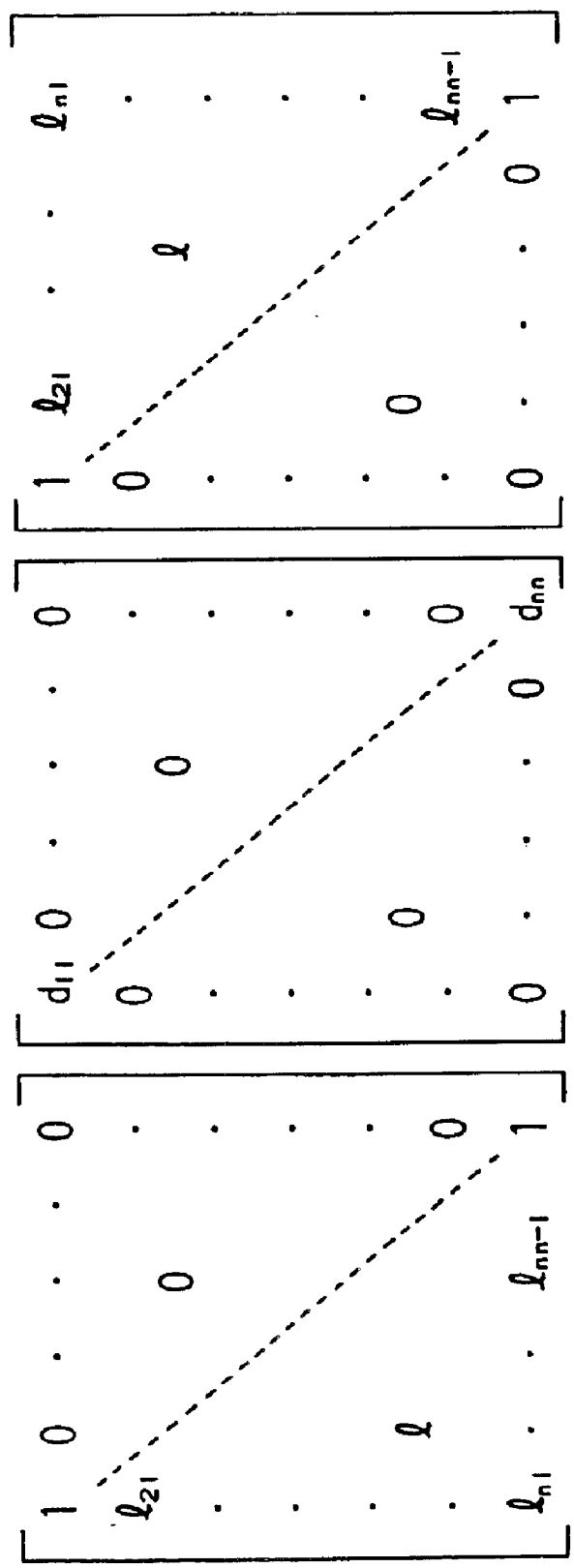
FIG. 16 is a view explaining LDU decomposition.

On the other hand, when the program judges at step 9 that the wave source of the electronic apparatus being simulated must be considered, the program proceeds to step 13, where it applies LDU decomposition on the mutual impedance $Z(z_{ij})$ calculated at step 8 in accordance with the LDU decomposition rules for a matrix. That is, it applies LDU decomposition to the mutual impedance $Z(z_{ij})$ as shown in FIG. 16. Here, the following stand for the matrix $D(d_{ij})$ and the matrix L ($l_{ij}$):

$$d_{ii}=z_{ii}-\Sigma d_{ii}l_{kk}$$

where, $\Sigma$ is the sum for k=1 to (i-1), i=1 to n $$l_{ij}=[z_{ij}-\Sigma d_{kk}l_{ik}l_{jk}]/d_{jj}$$

where, $\Sigma$ is the sum for k=1 to (J-1), i=1 to n, j<i $$l_{ii}=1$$

where, i=1 to n

Next, at step 14, the program solves the simultaneous equations for the carrier wave frequency under the moment method (wave source of electronic apparatus and wave source of antenna exist) having the mutual impedance obtained by the LDU decomposition at step 13 so as to calculate the electric current of the carrier wave frequency component flowing through the elements of the electronic apparatus segmented at step 4, solves the simultaneous equations for the upper sideband frequency under the moment method (wave source of electronic apparatus and wave source of antenna exists) having the mutual impedance obtained by the LDU decomposition at step 13 so as to calculate the electric current of the upper sideband frequency component flowing through the elements of the electronic apparatus segmented at step 4, and solves the simultaneous equations for the lower sideband frequency under the moment method having the mutual impedance obtained by the LDU decomposition at step 13 so as to calculate the electric current of the lower sideband frequency component flowing through the elements of the electronic apparatus segmented at step 4.

in solving the simultaneous equations under the moment method, the mutual impedance Z is subjected to LDU decomposition as shown in FIG. 16:

$$z=LDU=LD^tL$$

From this, the simultaneous equations under the moment method are defined, by using the LDU decomposed mutual impedance Z, as:

$$[LD^tL][I]=[V]$$

From this, the simultaneous equations under the moment method become equivalent to solving $$[D^tL][I]=[X] \text{ and } [L][X]=[V]$$

The equations can be solved at a high speed since the matrix is triangularly decomposed.

From this, by using the LDU decomposed mutual impedance common to the carrier wave frequency, the upper sideband frequency and the lower sideband frequency for solving the three simultaneous equations under the moment method at a high speed (greater number in the case of pulse modulation), the electric current of the carrier wave frequency component, the electric current of the upper sideband frequency component and the electric current of the lower sideband frequency component, flowing through the elements of the electronic apparatus, are calculated at a high speed.

Next, at step 15, the program uses the electric currents found at step 14 in accordance with the above method to calculate the voltage generated at a position between conductor elements specified by the operator, then at step 16 judges if the electric current flowing through an element specified by the operator exceeds a prescribed threshold and judges if the voltage generated at the position between conductor elements calculated at step 15 exceeds a prescribed threshold, registers the results of the above judgment, then returns to step 5 for the processing of the next carrier wave frequency.

When the program judges at step 6 that all of the frequencies have finished being selected by repeating the processings of step 5 to step 16 (except the processing of step 7), in the above way, the program proceeds to step 7 where it outputs the results of the simulation obtained at step 10, step 11, step 14 and step 16 to the output device 3 in accordance with the prescribed manner of outputting and ends the processing.

in this way, in accordance with the flow of processing of: FIG. 9 and FIG. 10, the simulation program 300 simulates the electric current flowing through the electronic apparatus to which a prescribed intensity of electric field is applied from an antenna and simulates the voltage generated at the electronic apparatus. At this time, the simulation program 300 uses the antenna model, registered in the antenna model library 200 to set the test conditions. The antenna model, as explained above, contains the test conditions for applying the prescribed intensity of an electric field to the electronic apparatus, so by using the antenna model, the simulation program 300 can immediately apply a prescribed intensity of an electric field to the electronic apparatus, without trial and error type processing, and can immediately simulate the effect on the electronic apparatus when the prescribed intensity of the electric field is applied.

At step 13 of this flow of processing, the simulation program 300 applied LDU decomposition on the mutual impedance, but it is also possible to apply LU decomposition on the mutual impedance.

Figure 17:
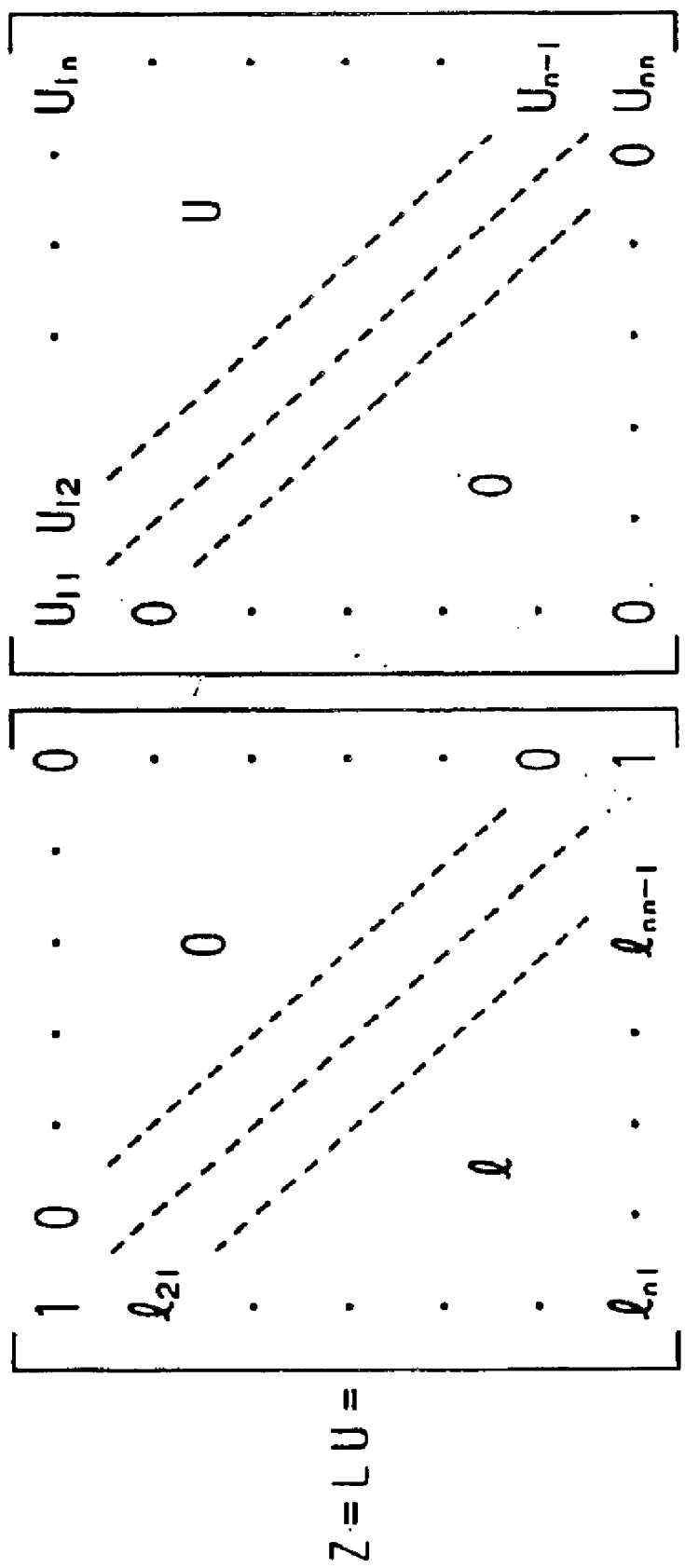
FIG. 17 is a view explaining LU decomposition.

That is, as shown in FIG. 17, it is also possible to apply LU decomposition to the mutual impedance in accordance with the LU decomposition rules for a matrix. Here, the following stand for the matrix $D(d_{ij})$, the matrix L ($l_{ij}$) and the matrix U ($u_{ij}$):

$$u_{ij} = z_{ij} - \Sigma l_{ik} u_{kj}^2$$

where, $\Sigma$ is the sum for k=1 to (i−1), j=1 to n, i=1 to j, i<j $$l_{ij} = [z_{ij} - \Sigma l_{ik} l_{kj}]/u_{jj}$$

where, $\Sigma$ is the sum for k=1 to (j−1), i=1 to n, j=1 to (i−1), j<i $$l_{ii} = 1$$

where, i=1 to n

The simultaneous equations under the moment method are defined, by using the LU decomposed mutual impedance Z, as:

$$[LU][I]=[V]$$

From this, the simultaneous equations under the moment method become: equivalent to solving $$[U][I]=[X] \text{ and } [L][X]=[V]$$

The equations can be solved at a high speed since the matrix is triangularly decomposed. Therefore, the mutual impedance may also be subjected to LU decomposition.

The present invention will be explained in further detail below:

When a radio wave radiated by an antenna is modulated by amplitude, if the radio wave is expanded in the frequency domain, as shown in FIG. 6A, it is broken down into the carrier wave having the frequency $f_c$, the upper sideband wave having the frequency $(f_c+f_x)$ and the lower sideband wave having the frequency $(f_c-f_m)$.

From this, if expressing the electric current flowing through an element due to a wave source of the frequency $(f_c-f_m)$ by $[I_1]$, the electric current flowing through an element due to a wave source of the frequency $f_c$ by $[I_2]$, the electric current flowing through an element due to a wave source of the frequency $(f_c+f_m)$ by $[I_3]$, the value of a wave source of a frequency $(f_c-f_m)$ by $[V_1]$, the value of a wave source of a frequency $f_c$ by $[V_2]$, the value of a wave source of a frequency $(f_c+f_m)$ by $[V_3]$, the mutual impedance at a frequency $(f_c-f_m)$ by $[Z(f_c-f_m)]$, the mutual impedance at a frequency $f_c$ by $[z(f_c)]$, and the mutual impedance at a frequency $(f_c+f_m)$ by $[Z(f_c+f_m)]$, the electric current flowing through the electronic apparatus due to a radio wave radiated by an antenna can be found by solving the simultaneous equations under the moment method of:

$$[Z(f_c-f_m)][i_1]=[V_1]$$

$$[Z(f_c)][i_2]=[V_2]$$

$$[Z(f_c+f_m)][i_3]=[V_3]$$

To realize high speed solution of the simultaneous equations under the moment method, the present invention, considering that:

$$(f_c-f_m) \approx f_c \approx (f_c+f_m)$$

adopts the approach of approximation of:

$$[Z(f_c-f_m)]=[Z(f_c)]=[Z(f_c+f_m)]$$

Taking this approach, first, for example, the program calculates $[Z(f_c)]$. Of course, it is also possible to calculate $[Z(f_c-f_m)]$, to calculate $[Z(f_c+f_m)]$, or to calculate the mutual impedance at another frequency close to the carrier wave frequency $f_c$ but it is preferable to calculate $[Z(f_c)]$ since the carrier wave frequency $f_c$ is positioned at central of the band.

For example, if calculating $[Z(f_c)]$, the electric current flowing through the electronic apparatus due to a radio wave radiated by an antenna is found by solving the three simultaneous equations of the moment method of:

$$[Z(f_c)][i_1]=[V_1]$$

$$[Z(f_c)][i_2]=[V_2]$$

$$[Z(f_c)][i_3]=[V_3]$$

in solving the simultaneous equations under the moment method, if it is possible to ignore the wave source of the electronic apparatus, then only the single wave source of the antenna is left as a wave source. Due to this, the relation of:

$$V_1:V_2:V_3=I_1:I_2:I_3$$

stands, so there is no need to solve the three simultaneous equations under the moment method. The electric current is found by solving just one among these and the electric currents of the remaining frequency components are found by proportional operations.

in this case, when the radio wave radiated by an antenna is modulated by pulse, there are a plurality of upper side frequencies and lower side frequencies, but in this case as well just one of the multiple (defined in accordance with the above) simultaneous equations under the moment method is solved and the electric currents of the remaining frequency components are found by proportional operations.

On the other hand, in solving the above simultaneous equations under the moment method, if it is not possible to ignore the wave source of the electronic apparatus and therefore the above-mentioned proportional relation does not stand between the electric current and the wave source, then it is necessary to solve the three simultaneous equations under the moment method (in the case of pulse modulation, a further larger number of simultaneous equations).

In this case as well, since the mutual impedances are assumed to be common, it is sufficient to calculate the mutual impedance just once, whereby it is possible to solve the simultaneous equations under the moment method at a high speed.

Further, at this time, LDU decomposition or LU decomposition may be applied to the mutual impedance in consideration of the fact that the mutual impedance is common. The processing time required increases due to the LDU decomposition or LU decomposition, but use of an LDU decomposed or LU decomposed mutual impedance enables the simultaneous equations under the moment method to be solved at a high speed. Due to this, when there are two or more simultaneous equations under the moment method to be solved, the total processing time can be greatly reduced. When a radio wave radiated by an antenna is modulated by pulse (pulse modulation), this method is extremely effective.

While not explained in the flow of processing of FIG. 9 and FIG. 10, there are cases where the wave source of the electronic apparatus can be ignored for some simultaneous equations among the plurality of simultaneous equations under the moment method. That is, in the case of amplitude modulation, there are three simultaneous equations under the moment method, while in the case of pulse modulation, there are a larger number of simultaneous equations under the moment method, but sometimes it is possible to ignore the wave source of the electronic apparatus for some simultaneous equations among them.

in such a case, while it is necessary to solve the simultaneous equations under the moment method for those of the wave sources of the electronic apparatus which cannot be ignored, it is possible to solve the simultaneous equations under the moment method for one of those of the wave sources of the electronic apparatus which can be ignored and find the electric currents for the remaining ones by proportional operations. In this case as well, the mutual impedance is calculated only once.

For example, when the basic frequency of a wave source of the electronic apparatus is 200 MHz at "$f_c$=800 MHz, $f_m$=1 kHz", the wave source of the electronic apparatus for "$f_c$=800 MHz" cannot be ignored, but the wave sources of the electronic apparatus for "$f_c-f_m$=799.999 MHz" and "$f_c+f_m$=800.001 MHz" can be ignored.

in this case, the simultaneous equation under the moment method for "$f_c$=800 MHz" is solved and the simultaneous equation under the moment method is solved for one of "$f_c-f_m$=799.999 MHz" and "$f_c+f_m$=800.001 MHz", for example "$f_c-f_m$=799.999 MHz", to calculate the electric currents of the frequency component, while the electric current component of "$f_c+f_m$=800.001 MHz" is found, by a proportional operation, by using the calculated electric current of 799.999 MHz, the wave source of the antenna at 799.999 MHz and the value of the wave source of the antenna at 800.001 MHz.

In this case, it is necessary to solve two simultaneous equations under the moment method in the case of amplitude modulation, while it is necessary to solve at least two simultaneous equations under the moment method in the case of pulse modulation. From this, it is preferable to apply LDU decomposition or LU decomposition on the mutual impedance as explained above and use the decomposed mutual impedance to solve the simultaneous equations under the moment method.

This embodiment assumed the solution of the simultaneous equations under the moment method shown in FIG. 13 considering only the mutual impedance, but the present invention may also be applied as it is to the case of solution of the simultaneous equations under the moment method shown in FIG. 18 considering the existence of a dielectric.

Solution of the simultaneous equations under the moment method shown in FIG. 18 requires calculation of not only the mutual impedance $Z_{ij}$, but also the mutual admittance $Y_{ij}$ and the mutual reaction $B_{ij}$ among elements. If the simultaneous equations under the moment method shown in FIG. 18 are solved, the electric current flowing at the surface of the dielectric and the magnetic current flowing at the surface of the dielectric are calculated.

Note that in the equation shown in FIG. 18, $I_{c,n}$ indicates the electric current flowing through metal, $I_{d,n}$, the electric current flowing at the surface of the dielectric, $M_n$ the magnetic current flowing at the surface of the dielectric, the superscript 0 the value in air, the superscript d the value in the dielectric, the suffix c metal, and the suffix d a dielectric.

Summarizing the advantageous effects of the invention, as explained above, since the apparatus for calculating immunity from a radiated electromagnetic field of one aspect of the present invention divides the radio wave radiated by an antenna into a carrier wave, upper sideband wave and lower sideband wave and uses the moment method to simulate the effect of the radio wave radiated by an antenna by calculating the mutual impedance for only one frequency component, using that mutual impedance to solve the simultaneous equations under the moment method for the carrier wave frequency to calculate the electric current of the carrier wave frequency component flowing through an electronic apparatus due to a radio wave radiated by an antenna, solving the simultaneous equations under the moment method for the upper sideband frequency to calculate the electric current of the upper sideband frequency component flowing through the electronic apparatus due to a radio wave radiated by an antenna, and solving the simultaneous equations under the moment method for the lower sideband frequency to calculate the electric current of the lower sideband frequency component flowing through the electronic apparatus due to a radio wave radiated by an antenna, it is possible to simulate the electric current flowing through the electronic apparatus at a high speed.

Further, since the apparatus for calculating immunity from a radiated electromagnetic field of another aspect of the present invention divides a radio wave radiated by an antenna into a carrier wave, upper sideband wave and lower sideband wave and uses the moment method to simulate the effect of a radio wave radiated by an antenna by calculating the mutual impedance for only one frequency component, using that mutual impedance to solve the simultaneous equations under the moment method for one of the frequencies, while ignoring the wave source of the electronic apparatus, to calculate the electric current of that frequency component flowing through an electronic apparatus, and calculating the electric currents of the remaining frequency components by proportional operations, it is possible to simulate the electric current flowing through the electronic apparatus due to a radio wave radiated by an antenna at a high speed.

Further, since the apparatus for calculating immunity from a radiated electromagnetic field of still another aspect of the present invention divides a radio wave radiated by an antenna into a carrier wave, upper sideband wave and lower sideband wave and uses the moment method to simulate the effect of a radio wave radiated by an antenna by calculating the mutual impedance for only one frequency component, using that mutual impedance to solve the simultaneous equations under the moment method for the frequency overlapping the frequency of a wave source of the electronic apparatus to calculate the electric current of that frequency component flowing through the electronic apparatus, solving the simultaneous equations under the moment method for just one of the electric currents of the nonoverlapping frequency components to calculate the electric current of that frequency component flowing through the electronic apparatus, and calculating the electric current of the remaining frequency components by proportional operations, it is possible to simulate the electric current flowing through the electronic apparatus due to a radio wave radiated by an antenna at a high speed Further, since the apparatus for calculating immunity from a radiated electromagnetic field of still another aspect of the present invention uses the moment method to simulate the effect of a radio wave radiated by an antenna by preparing in advance antenna information realizing a prescribed intensity of an electric field on an electronic apparatus and using that antenna information to solve the simultaneous equations under the moment method to calculate the electric current flowing through the electronic apparatus when there is a simulation request, it is possible to simulate the electric current flowing through the electronic apparatus due to the application of the prescribed intensity of an electric field due to a radio wave radiated by an antenna at a high speed.

In this way, according to the apparatus for calculating immunity from a radiated electromagnetic field of the present invention, it becomes possible to simulate the electric current flowing through an electronic apparatus due to a radio wave radiated by an antenna at a high speed.

While the invention has been described by reference to specific embodiments chosen for purposes of illustration, it should be apparent that numerous modifications could be made thereto by those skilled in the art without departing from the basic concept and scope of the invention.

What is claimed is:

1. An apparatus for calculating immunity from a radiated electromagnetic field which segments an antenna and electronic apparatus into elements, calculates a single common mutual impedance among the elements, and solves simultaneous equations under a moment method defining a relationship among the mutual impedance, a wave source and an electric current flowing through the electronic apparatus so as to simulate the electric current flowing through the electronic apparatus due to a radio wave radiated by the antenna, the radio wave having wave components comprising a carrier wave component, an upper sideband wave component, and a lower sideband wave component, the apparatus comprising:

a first calculating unit setting a representative frequency representative of the carrier wave frequency, representative of the upper sideband frequency, and representative of the lower sideband frequency, and calculating, among elements at the set representative frequency, the single common mutual impedance which commonly represents the mutual impedance of each of the carrier wave frequency, the upper sideband frequency, and the lower sideband frequency; and a second calculating unit solving a single system of simultaneous; equations under the moment method having the single common mutual impedance calculated by the first calculating unit to calculate a total electric current flowing through the electronic apparatus due to the wave components of the radio wave radiated by the antenna.

2. An apparatus for calculating immunity from a radiated electromagnetic field as set forth in claim 1, further comprising:

a decomposing unit applying one of LU decomposition and LDU decomposition on a matrix of the common mutual impedance calculated by the first calculating unit, wherein the second calculating unit solving the simultaneous equations under the moment method using the matrix of the common mutual impedances decomposed by the decomposing unit.

3. An apparatus for calculating immunity from a radiated electromagnetic field as set forth in claim 2, wherein when considering a dielectric, a mutual admittance and mutual reaction among elements at the representative frequency are calculated in addition to the mutual impedance and processing is performed in accordance with simultaneous equations under the moment method, considering a dielectric, having the mutual impedance, mutual admittance and mutual reaction.

4. An apparatus for calculating immunity from a radiated electromagnetic field as set form in claim 1, wherein when considering a dielectric, a mutual admittance and mutual reaction among elements at the representative frequency are calculated in addition to the mutual impedance and processing is performed in accordance with simultaneous equations under the moment method, considering a dielectric, having the mutual impedance, mutual admittance and mutual reaction.

5. An apparatus for calculating immunity from a radiated electromagnetic field which segments an antenna and electronic apparatus into elements, calculates a single mutual impedance among the elements, and solves simultaneous equations under a moment method defining a relationship among the single mutual impedance, a wave source and an electric current flowing through the electronic apparatus so as to simulate the electric current flowing through the electronic apparatus due to a radio wave radiated by the antenna, the radio wave having components comprising a carrier wave component, an upper sideband wave component, and a lower sideband wave component, the apparatus comprising:

a first calculating unit setting a representative frequency with respect to a carrier wave frequency, at least one upper sideband frequency and at least one lower sideband frequency and calculating the single mutual impedance among elements at that representative frequency;

a second calculating unit solving a single system of simultaneous equations under the moment method having the single mutual impedance calculated by the first calculating unit, while ignoring a wave source of the electronic apparatus, for one of the carrier wave frequency, upper sideband frequency and lower sideband frequency to calculate the electric current flowing through the electronic apparatus due to the radio wave radiated by the antenna; and a third calculating unit calculating, the electric currents, other than the electric current calculated by the second calculating unit, flowing through the electronic apparatus due to the radio wave radiated by the antenna, by using a proportional relation between the electric current calculated by the second calculating unit and a value of a wave source of the antenna at the representative frequency, from among the carrier wave frequency, upper sideband frequency and lower sideband frequency, for which the second calculating unit calculated the above electric current, and applying the proportional relation to a value of a component of the wave source of the antenna at the frequency other than the above frequency for which the second calculating unit calculated the above electric current.

6. An apparatus for calculating immunity from a radiated electromagnetic field as set forth in claim 5, wherein when considering a dielectric, a mutual admittance and mutual reaction among elements at the representative frequency are calculated in addition to the mutual impedance and processing is performed in accordance with simultaneous equations under the moment method, considering a dielectric, having the mutual impedance, mutual admittance and mutual reaction.

7. An apparatus for calculating immunity from a radiated electromagnetic field which segments an antenna and electronic apparatus into elements, calculates a mutual impedance among elements, and solves simultaneous equations under a moment method defining a relationship among the mutual impedance, a wave source, and an electric current flowing through the electronic apparatus so as to simulate the electric current flowing through the electronic apparatus due to a radio wave radiated by the antenna, comprising:

a first calculating unit setting a representative frequency with respect to a carrier wave frequency, at least one upper sideband frequency and at least one lower sideband frequency and calculating the mutual impedance among elements at that representative frequency;

a second calculating unit solving simultaneous equations under the moment method having the mutual impedance calculated by the first calculating unit for one of the carrier wave frequency, upper sideband frequency and lower sideband frequency which overlaps a frequency, including a higher harmonic component, of a wave source of the electronic apparatus, to calculate the electric current flowing through the electronic apparatus due to the radio wave radiated by the antenna;

a third calculating unit solving the simultaneous equations under the moment method having the mutual impedance calculated by the first calculating unit for one of the frequencies not used in the calculation by the second calculating unit to calculate the electric current, other than the electric current calculated by the second calculating unit, flowing through the electronic apparatus due to the radio wave radiated by the antenna, and a fourth calculating unit calculating the electric current, other than the electric currents calculated by the second and third calculating unit, flowing through the electronic apparatus due to the radio wave radiated by the antenna, by proportional operations, by using the electric current calculated by the third calculating unit and a value of a wave source of the antenna at the frequency, from among the carrier wave frequency, upper sideband frequency and lower sideband frequency, for which the third calculating unit calculated the above electric current and a value of a wave source of the antenna at the frequency other than the above frequency for which the third calculating unit calculated the above electric current.

8. An apparatus for calculating immunity from a radiated electromagnetic field as set forth in claim 7, further comprising:

a decomposing unit applying one of LU decomposition and LDU decomposition on a matrix of the mutual impedance calculated by the first calculating unit, the second and third calculating unit solving the simultaneous equations under the moment method using the matrix of mutual impedance decomposed by the decomposing unit.

9. An apparatus for calculating immunity from a radiated electromagnetic field as set forth in claim 8, wherein when considering a dielectric, a mutual admittance and mutual reaction among elements at the representative frequency are calculated in addition to the mutual impedance and processing is performed in accordance with simultaneous equations under the moment method, considering a dielectric, having the mutual impedance, mutual admittance and mutual reaction.

10. An apparatus for calculating immunity from a radiated electromagnetic field as set forth in claim 7, wherein when considering a dielectric, a mutual admittance and mutual reaction among elements at the representative frequency are calculated in addition to the mutual impedance and processing is performed in accordance with simultaneous equations under the moment method, considering a dielectric, having the mutual impedance, mutual admittance and mutual reaction.

11. A method for calculating immunity from a radiated electromagnetic field which segments an antenna and electronic apparatus into elements, calculates a single mutual impedance among the elements, and solves simultaneous equations under a moment method defining a relationship among the single mutual impedance, a wave source and an electric current flowing through the elements so as to simulate the electric current flowing through the electronic apparatus due to a radio wave radiated by the antenna, the radio wave having components comprising a carrier wave component, an upper sideband wave component, and a lower sideband wave component, the method comprising:

a first processing operation setting a representative frequency with respect to a carrier wave frequency, at least one upper sideband frequency and at least one lower sideband frequency and calculating the single mutual impedance among elements at that representative frequency;

a second processing operation solving a single system of simultaneous equations under the moment method having the single mutual impedance calculated at the first processing operation, while ignoring a wave source of the electronic apparatus, for one of the carrier wave frequency, upper sideband frequency and lower sideband frequency to calculate the electric current flowing through the electronic apparatus due to the radio wave radiated by the antenna; and a third processing operation calculating the electric currents, other than the electric current calculated at the second processing operation, flowing through the electronic apparatus due to the radio wave radiated by the antenna, by using a proportional relation between the electric current calculated at the second processing operation and a value of a wave source of the antenna at the representative frequency, from among the above carrier wave frequency, upper sideband frequency and lower sideband frequency, for which the above electric current was calculated at the second processing operation and applying the proportional relation to a value of a component of the wave source of the antenna at the frequency other than the above frequency for which the above electric current was calculated at the second processing operation.

12. A program storage medium storing information used for realization or an apparatus for calculating immunity from a radiated electromagnetic field which segments an antenna and electronic apparatus into elements, calculates a single common mutual impedance among the elements, and solves simultaneous equations under a moment method defining a relationship among the single mutual impedance, a wave source and an electric current flowing through the electronic apparatus so as to simulate the electric current flowing through the electronic apparatus due to a radio wave radiated by the antenna, the radio wave having wave components comprising a carrier wave component, an upper sideband wave component, and a lower sideband wave component, the program storage storing information for executing by a computer;

a first calculation processing of setting a representative frequency representative of a carrier wave frequency, representative of the upper sideband frequency, and representative of the lower sideband frequency, and calculating, among elements at the set representative frequency, the single common mutual impedance which commonly represents the mutual impedance of each of the carrier wave frequency, the upper sideband frequency, and the lower sideband frequency; and a second calculation processing of solving a single system of simultaneous equations under the moment method having the single common mutual impedance; calculated at the first calculation processing to calculate the total electric current flowing through the electronic apparatus due to the wave components of the radio wave radiated by the antenna.

13. A program storage medium storing information used for realization of an apparatus for calculating immunity from a radiated electromagnetic field, which segments an antenna and electronic apparatus into elements, calculates a single mutual impedance among the elements, and solves simultaneous equations under a moment method defining a relationship among the single mutual impedance, a wave source and an electric current flowing through the electronic apparatus so as to simulate the electric current flowing through the electronic apparatus due to a radio wave radiated by the antenna, the radio wave having components comprising a carrier wave component, an upper sideband wave component, and a lower sideband wave component the storage storing information for executing by a computer;

a first calculation processing of setting a representative frequency with respect to a carrier wave frequency, at least one upper sideband frequency and at least one lower sideband frequency and calculating the single mutual impedance among elements at that representative frequency;

a second calculation processing of solving a single system of simultaneous equations under the moment method having the single mutual impedance calculated at the first calculation processing, while ignoring a wave source of the electronic apparatus, for one of the carrier wave frequency, upper sideband frequency and lower sideband frequency to calculate the electric current flowing through the electronic apparatus due to the radio wave radiated by the antenna; and a third calculation processing of calculating the electric currents, other than the electric current calculated at the second calculation processing, flowing through the electronic apparatus due to the radio wave radiated by the antenna, by using a proportional relation between the electric current calculated at the second calculation processing and a value of a wave source of the antenna at the representative frequency, from among the above carrier wave frequency, upper sideband frequency and lower sideband frequency, for which the above electric current was calculated at the second calculation processing, and applying the proportional relation to a value of a component of the wave source of the antenna at the frequency other than the above frequency for which the above electric current was calculated at the second calculation processing.

14. A program storage medium storing programs used for realization of an apparatus for calculating immunity from a radiated electromagnetic field which segments an antenna and electronic apparatus into elements, calculates a mutual impedance among elements, and solves simultaneous equations under a moment method defining a relationship among the mutual impedance, a wave source, and an electric current flowing through the electronic apparatus, so as to simulate the electric current flowing through the electronic apparatus due to a radio wave radiated by the antenna, storing a program for executing by a computer:

a first calculation processing of setting a representative frequency with respect to a carrier wave frequency, at least one upper sideband frequency, and at least one lower sideband frequency and calculating the mutual impedance among elements at that representative frequency;

a second calculation processing of solving simultaneous equations under the moment method having the mutual impedance calculated at the first calculation processing for one of the carrier wave frequency, upper sideband frequency and lower sideband frequency which overlaps a frequency, including a higher harmonic component, of a wave source of the electronic apparatus, to calculate the electric current flowing through the electronic apparatus due to the radio wave radiated by the antenna;

a third calculation processing of solving the simultaneous equations under the moment method having the mutual impedance calculated at the first calculation processing for one of the frequencies not used at the second calculation processing to calculate the electric current, other than the electric current calculated at the second calculation processing, flowing through the electronic apparatus due to the radio wave radiated by the antenna; and a fourth calculation processing of calculating the electric current, other than the electric currents calculated at the second and third calculation processings, flowing through the electronic apparatus due to the radio wave radiated by the antenna, by a proportional operation, by using the electric current calculated at the third calculation processing and a value of a wave source of the antenna at the frequency, from among the above carrier wave frequency, upper sideband frequency and lower sideband frequency, for which the above electric current was calculated at the third calculation processing and a value of a wave source of the antenna at the frequency other than the above frequency for which the above electric current was calculated at the third calculation processing.

15. An apparatus for calculating immunity from a radiated electromagnetic field which simulates an electric current flowing through an electronic apparatus due to a radio wave radiated by an antenna, the radio wave having wave components comprising a carrier wave component, an upper sideband wave component, and a lower sideband wave component, the apparatus comprising:
   a managing means for managing antenna information for realizing a prescribed intensity of an electric field on the electronic apparatus;
   an acquiring means for acquiring antenna information used for the simulation from the managing means when a request for simulation is issued;
   a calculating means for segmenting the electronic apparatus and the antenna specified by the antenna information acquired by the acquiring means into elements, calculating a mutual impedance among elements, and solving simultaneous equations under a moment method defining a relationship among the single mutual impedance, a wave source and an electric current flowing through the electronic apparatus so as to calculate the electric current flowing through the electronic apparatus due to the radio wave radiated by the antenna; and the calculating means comprising:
      a first calculating means for setting a representative frequency representative of a carrier wave frequency, representative of the upper sideband frequency, and representative of the lower sideband frequency, and calculating, among elements at the set representative frequency, the single common mutual impedance which commonly represents the mutual impedance of each of the carrier wave frequency, the upper sideband frequency, and the lower sideband frequency, and
      a second calculating means for solving a single system of simultaneous equations under the moment method having the single Common mutual impedance calculated by the first calculating means to calculate a total electric current rowing through the electronic apparatus due to the wave components of the radio wave radiated by the antenna.

16. An apparatus for calculating immunity from a radiated electromagnetic field as set forth in claim 15, further comprising:
   a setting means for setting a threshold voltage for a position between specified conductor elements; and
   an alarm means for comparing a voltage generated at a specified position between conductor elements, derived by making the voltage generated across a resistor, virtually inserted between the conductor elements, one obtained if the resistor has an infinitely large resistance, and the threshold voltage set by the setting means and outputting information on whether said voltage exceeds said threshold voltage or not.

17. An apparatus for calculating immunity from a radiated electromagnetic field as set forth in claim 16, further comprising:
   a first computing means for assuming a state where there is no electronic apparatus, segmenting the antenna to be registered in the managing means into elements, calculating the mutual impedance among these elements, end solving the simultaneous equations under the moment method defining the relationship among the calculated mutual impedance, wave source of the antenna, end an electric current flowing through the elements so as to calculate the electric current flowing through these antenna elements;
   a second computing means for calculating the intensity of the electric fields which the electric current calculated by the first computing means causes in the electronic apparatus at different locations of installation; and
   an executing means for changing the distance between the antenna and electronic apparatus and the value of the wave source of the antenna to determine the specific distance and value of the wave source giving the prescribed intensity of electric field calculated by the second computing means and registering the thus prescribed antenna information in the managing means.

18. An apparatus for calculating immunity from a radiated electromagnetic field as set forth in claim 17, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

19. An apparatus for calculating immunity from a radiated electromagnetic field as set forth in claim 16, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

20. An apparatus for calculating immunity from a radiated electromagnetic field as set forth in claim 15, further comprising:
   a first computing means for assuming a state where there is no electronic apparatus, segmenting the antenna to be registered in the managing means into elements, calculating the mutual impedance among these elements, and solving the simultaneous equations under the moment method defining the relationship among the calculated mutual impedance, wave source of the antenna, and an electric current flowing through the elements so as to calculate the electric current flowing through these antenna elements;
   a second computing means for calculating the intensity of the electric fields which the electric current calculated by the first computing means causes in the electronic apparatus at different locations of installation; and
   an executing means for changing the distance between the antenna and electronic apparatus and the value of the wave source of the antenna to determine the specific distance and value of the wave source giving the prescribed intensity of electric field calculated by the second computing means and registering the thus prescribed antenna information in the managing means.

21. An apparatus for calculating immunity from a radiated electromagnetic field as set forth in claim 20, wherein said first computing means solves the simultaneous equations under the moment method for one frequency among a carrier wave frequency, of upper sideband frequency and lower sideband frequency to calculate the electric current flowing through the antenna.

22. An apparatus for calculating immunity from a radiated electromagnetic field as stet forth in claim 21, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

23. An apparatus for calculating immunity from a radiated electromagnetic field as set forth in claim 26, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

24. An apparatus for calculating immunity from a radiated electromagnetic field as set forth in claim 15, wherein said first computing means solves the simultaneous equations under the moment method for one frequency among a carrier wave frequency, of upper sideband frequency and lower sideband frequency to calculate the electric current flowing through the antenna.

25. An apparatus for calculating immunity from a radiated electromagnetic field as set forth in claim 24, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

26. An apparatus for calculating immunity from a radiated electromagnetic field as set forth in claim 15, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

27. An apparatus for calculating immunity from a radiated electromagnetic field which simulates an electric current flowing through an electronic apparatus due to a radio wave radiated by an antenna, comprising:

a managing means for managing antenna information for realizing a prescribed intensity of an electric field on the electronic apparatus;

an acquiring means for acquiring antenna information used for the simulation from the managing means when a request for simulation is issued;

a calculating means for segmenting the electronic apparatus and the antenna specified by the antenna information acquired by the acquiring means into elements, calculating a single mutual impedance among the elements, and solving simultaneous equations under a moment method defining a relationship among the single mutual impedance, a wave source and an electric current flowing through the electronic apparatus so as to calculate the electric current flowing through the electronic apparatus due to the radio wave radiated by the antenna; and the calculating means comprising:

a first calculating means for setting a representative frequency with respect to a carrier wave frequency, at least one upper sideband frequency and at least one lower sideband frequency and calculating the single mutual impedance, as a common mutual impedance for the carrier wave frequency, upper sideband frequency and lower sideband frequency, among elements at that representative frequency, a second calculating means for solving a single system of simultaneous equations under the moment method having the single common mutual impedance calculated by the first calculating means for the carrier wave frequency, upper sideband frequency and lower sideband frequency to calculate the electric current flowing through the electronic apparatus due to the radio wave radiated by the antenna, and a third calculating means for calculating the electric currents, other than the electric current calculated by the second calculating means, flowing through the electronic apparatus due to the radio wave radiated by the antenna, by using a proportional relation between the electric current calculated by the second calculating means and a value of a wave source of the antenna at the representative frequency, from among the carrier wave frequency, upper sideband frequency and lower sideband frequency, for which the second calculating means calculated the above electric current, and applying the proportional relation to a value of a component of the wave source of the antenna at the frequency other than the above frequency for which the second calculating means calculated the above electric current.

28. An apparatus for calculating immunity from a radiated electromagnetic field as set forth in claim 27, further comprising:

a setting means for setting a threshold voltage for a position between specified conductor elements; and an alarm means for comparing a voltage generated at a specified position between conductor elements, derived by making the voltage generated across a resistor, virtually inserted between the conductor elements, one obtained if the resistor has an infinitely large resistance, and the threshold voltage set by the setting means and outputting information on whether said voltage exceeds said threshold voltage or not.

29. An apparatus for calculating immunity from a radiated electromagnetic field as set forth in claim 28, further comprising:

a first computing means for assuming a state where there is no electronic apparatus, segmenting the antenna to be registered in the managing means into elements, calculating the mutual impedance among these elements, and solving the simultaneous equations under the moment method defining the relationship among the calculated mutual impedance, wave source of the antenna, and an electric current flowing through the elements so as to calculate the electric current flowing through these antenna elements;

a second computing means for calculating the intensity of the electric fields which the electric current calculated by the first computing means causes in the electronic apparatus at different locations of installation; and an executing means for changing the distance between the antenna and electronic apparatus end the value of the wave source of the antenna to determine the specific distance and value of the wave source giving the prescribed intensity of electric field calculated by the second computing means and registering the thus prescribed antenna information in the managing means.

30. An apparatus for calculating immunity from a radiated electromagnetic field as set forth in claim 29, wherein
said first computing means solves the simultaneous equations under the moment method for one frequency among a carrier wave frequency, of upper sideband frequency and lower sideband frequency to calculate the electric current flowing through the antenna.

31. An apparatus for calculating immunity from a radiated electromagnetic field as set forth in claim 30, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

32. An apparatus for calculating immunity from a radiated electromagnetic field as set forth in claim 29, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

33. An apparatus for calculating immunity from a radiated electromagnetic field as set forth in claim 28, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

34. An apparatus for calculating immunity from a radiated electromagnetic field as set forth in claim 27, further comprising:
a first computing means for assuming a state where there is no electronic apparatus, segmenting the antenna to be registered in the managing means into elements, calculating the mutual impedance among these elements, and solving the simultaneous equations under the moment method defining the relationship among the calculated mutual impedance, wave source of the antenna, and an electric current flowing through the elements so as to calculate the electric current flowing through these antenna elements;
a second computing means for calculating the intensity of the electric fields which the electric current calculated by the first computing means causes in the electronic apparatus at different locations of installation; and
an executing means for changing the distance between the antenna and electronic apparatus end the value of the wave source of the antenna to determine the specific distance and value of the wave source giving the prescribed intensity of electric field calculated by the second computing means and registering the thus prescribed antenna information in the managing means.

35. An apparatus for calculating immunity from a radiated electromagnetic field as set forth in claim 34, wherein said first computing means solves the simultaneous equations under the moment method for one frequency among a carrier wave frequency, of upper sideband frequency and lower sideband frequency to calculate the electric current flowing through the antenna.

36. An apparatus for calculating immunity from a radiated electromagnetic field as set forth in claim 35, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

37. An apparatus for calculating immunity from a radiated electromagnetic field as set forth in claim 34, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

38. An apparatus for calculating immunity from a radiated electromagnetic field as set forth in claim 27, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

39. An apparatus for calculating immunity from a radiated electromagnetic field which simulates an electric current flowing through an electronic apparatus due to a radio wave radiated by an antenna, comprising:
a managing means for managing antenna information for realizing a prescribed intensity of an electric field on the electronic apparatus;
an acquiring means for acquiring antenna information used for the simulation from the managing means when a request for simulation is issued;
a calculating means for segmenting the electronic apparatus and the antenna specified by the antenna information acquired by the acquiring means into elements, calculating a mutual impedance among elements, and solving simultaneous equations under a moment method defining a relationship among the mutual impedance, a wave source and an electric current flowing through the electronic apparatus so as to calculate the electric current flowing through the electronic apparatus due to the radio wave radiated by the antenna; and
the calculating means comprising:
a first calculating means for setting a representative frequency with respect to a carrier wave frequency, at least one upper sideband frequency and at least one lower sideband frequency and calculating the mutual impedance, as a common mutual impedance for the carrier wave frequency, upper sideband frequency and lower sideband frequency, among elements at that representative frequency,
a second calculating means for solving simultaneous equations under the moment method having the common mutual impedance calculated by the first calculating means for the carrier wave frequency, upper sideband frequency and lower sideband frequency to calculate that electric current flowing through the electronic apparatus due to the radio wave radiated by the antenna, a third calculating means for calculating the electric currents, other than the electric current calculated by the second calculating means, flowing through the electronic apparatus due to the radio wave radiated by the antenna, by proportional operations, by using the electric current calculated by the second calculating means and a value of a wave source of the antenna at the frequency, from among the carrier wave frequency, upper sideband frequency and lower sideband frequency, for which the second calculating means calculated the above electric current and a value of a wave source of the antenna at the frequency other then the above frequency for which the second calculating means calculated the above electric current, and a fourth calculating means for calculating the electric currents, other than the electric currents calculated by the second and third calculating means, flowing through the electronic apparatus due to the radio wave radiated by the antenna, by proportional operations, by using the electric current calculated by the third calculating means and a value of a wave source of the antenna at the frequency, from among the carrier wave frequency, upper sideband frequency and lower sideband frequency, for which the third calculating means calculated the above electric current and a value of a wave source of the antenna at the frequency other than the above frequency for which the third calculating means calculated the above electric current.

40. An apparatus for calculating immunity from a radiated electromagnetic field as set forth in claim 39, further comprising:

a setting means for setting a threshold voltage for a position between specified conductor elements; and an alarm means for comparing a voltage generated at a specified position between conductor elements, derived by making the voltage generated across a resistor, virtually inserted between the conductor elements, one obtained if the resistor has an infinitely large resistance, and the threshold voltage set by the setting means and outputting information on whether said voltage exceeds said threshold voltage or not.

41. An apparatus for calculating immunity from a radiated electromagnetic field as set forth in claim 40, further comprising:

a first computing means for assuming a state where there is no electronic apparatus, segmenting the antenna to be registered in the managing means into elements, calculating the mutual impedance among these elements, and solving the simultaneous equations under the moment method defining the relationship among the calculated mutual impedance, wave source of the antenna, and an electric current flowing through the elements so as to calculate the electric current flowing through these antenna elements;

a second computing means for calculating the intensity of the electric fields which the electric current calculated by the fist computing means causes in the electronic apparatus at different locations of installation; and an executing means for changing the distance between the antenna and electronic apparatus and the value of the wave source of the antenna to determine the specific distance and value of the wave source giving the prescribed intensity of electric field calculated by the second computing means and registering the thus prescribed antenna information in the managing means.

42. An apparatus for calculating immunity from a radiated electromagnetic field as set forth in claim 41, wherein said first computing means solves the simultaneous equations under the moment method for one frequency among a carrier wave frequency, of upper sideband frequency and lower sideband frequency to calculate the electric current flowing through the antenna.

43. An apparatus for calculating immunity from a radiated electromagnetic field as set forth in claim 42, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

44. An apparatus for calculating immunity from a radiated electromagnetic field as set forth in claim 41, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

45. An apparatus for calculating immunity from a radiated electromagnetic field as set forth in claim 40, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

46. An apparatus for calculating immunity from a radiated electromagnetic field as set forth in claim 39, further comprising:

a first computing means to assuming a state where there is no electronic apparatus, segmenting the antenna to be registered in the managing means into elements, calculating the mutual impedance among these elements, and solving the simultaneous equations under the moment method defining the relationship among the calculated mutual impedance, wave source of the antenna, and an electric current flowing through the elements so as to calculate the electric current flowing through these antenna elements;

a second computing means for calculating the intensity of the electric fields which the electric current calculated by the first computing means causes in the electronic apparatus at different locations of installation; and an executing means for changing the distance between the antenna and electronic apparatus and the value of the wave source of the antenna to determine the specific distance end value of the wave source giving the prescribed intensity of electric field calculated by the second computing means and registering the thus prescribed antenna information in the managing means.

47. An apparatus for calculating immunity from a radiated electromagnetic field as set forth in claim 46, wherein said first computing means solves the simultaneous equations under the moment method for one frequency among a carrier wave frequency, of upper sideband frequency and lower sideband frequency to calculate the electric current flowing through the antenna.

48. An apparatus for calculating immunity from a radiated electromagnetic field as set forth in claim 47, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

49. An apparatus for calculating immunity from a radiated electromagnetic field as set forth in claim 46, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual, impedance, mutual admittance and mutual reaction.

50. An apparatus for calculating immunity from a radiated electromagnetic field as set forth in claim 39, wherein when considering a dielectric, a mutual admittance and a mutual reaction among the elements at the representative frequency are calculated in addition to the mutual impedance and processing is performed in accordance with simultaneous equations under the moment method, considering a dielectric, having the mutual impedance, mutual admittance and mutual reaction.

51. A storage storing information enabling a computing device to perform a process for calculating immunity of an electronic apparatus from a radiated electromagnetic field, the process comprising:

a managing process managing antenna information for realizing a prescribed intensity of an electric field on the electronic apparatus;

an acquiring process acquiring antenna information used for the simulation from the managing process when a request for simulation is issued;

a calculating process segmenting the electronic apparatus and an antenna specified by the antenna information acquired by the acquiring process into elements, calculating a single common mutual impedance among the elements, and solving simultaneous equations under a moment method defining a relationship among the single mutual impedance, a wave source and an electric current flowing through the electronic apparatus so as to calculate the electric current flowing through the electronic apparatus due to a radio wave radiated by the antenna , the radio wave having wave components comprising a carrier wave component, an upper sideband wave component, and a lower sideband wave component;

the calculating process comprising:
 a first calculating process for setting a representative frequency representative of a carrier wave frequency, representative of the upper sideband frequency, and representative of the lower sideband frequency, and calculating, among elements at the set representative frequency, the single common mutual impedance which commonly represents the mutual impedance of each of the carrier wave frequency, the upper sideband frequency and the lower sideband frequency, and
 a second calculating process for solving a single system of simultaneous equations under the moment method having the single common mutual impedance calculated by the first calculating process to calculate a total electric current flowing through the electronic apparatus due to the wave components of the radio wave radiated by the antenna.

52. A storage storing information enabling a computing device to perform a process for calculating immunity of an electronic apparatus from a radiated electromagnetic field, the process comprising:

a managing process managing antenna information for realizing a prescribed intensity of an electric field on the electronic apparatus;

an acquiring process acquiring antenna information used for the simulation from the managing process when a request for simulation is issued;

a calculating process segmenting the electronic apparatus and an antenna specified by the antenna information acquired by the acquiring process into elements, calculating a single mutual impedance among the elements, and saving simultaneous equations under a moment method defining a relationship among the single mutual impedance, a wave source and an electric current flowing through the electronic apparatus so as to calculate the electric current flowing through the electronic apparatus due to a radio wave radiated by the antenna, the radio wave having components comprising a carrier wave component, an upper sideband wave component, and a lower sideband wave component; and the calculating process comprising:
 a first calculating process setting a representative frequency with respect to a carrier wave frequency, at least one upper sideband frequency and at least one lower sideband frequency and calculating the single mutual impedance, as a common mutual impedance for the carrier wave frequency, upper sideband frequency and lower sideband frequency, among elements at that representative frequency,
 a second calculating process solving a single system of simultaneous equations under the moment method having the single mutual impedance calculated by the first calculating process for the carrier wave frequency, upper sideband frequency and lower sideband frequency to calculate the electric current flowing through the electronic apparatus due to the radio wave radiated by the antenna, and
 a third calculating process calculating the electric currents, other than the electric current calculated by the second calculating process, flowing through the electronic apparatus due to the radio wave radiated by the antenna, by using a proportional relation between the electric current calculated by the second calculating process and a value of a wave source of the antenna at the representative frequency, from among the carrier wave frequency, upper sideband frequency and lower sideband frequency, for which the second calculating process calculated the above electric current, and applying the proportional relation to a value of a component of the wave source of the antenna at the frequency other than the above frequency for which the second calculating process calculated the above electric current.

53. A storage storing information enabling a computing device to perform a process for calculating immunity of an electronic apparatus from a radiated electromagnetic field, the process comprising:

a managing process managing antenna information for realizing a prescribed intensity of an electric field on the electronic apparatus;

an acquiring process acquiring antenna information used for the simulation from the managing process when a request for simulation is issued;

a calculating process segmenting the electronic apparatus and ran antenna specified by the antenna information acquired by the acquiring process into elements, calculating a mutual impedance among elements, and solving simultaneous equations under a moment method defining a relationship among the mutual impedance, a wave source and an electric current flowing through the electronic apparatus so as to calculate the electric current flowing through the electronic apparatus due to a radio wave radiated by the antenna; and the calculating process comprising:

a first calculating process setting a representative frequency with respect to a carrier wave frequency, at least one upper sideband frequency and at least one lower sideband frequency and calculating the mutual impedance, as a common mutual impedance for the carrier wave frequency, upper sideband frequency and lower sideband frequency, among elements at that representative frequency, a second calculating process solving simultaneous equations under the moment method having the common mutual impedance calculated by the first calculating process for the carrier wave frequency, upper sideband frequency and lower sideband frequency to calculate the electric current flowing through the electronic apparatus due to the radio wave radiated by the antenna, a third calculating process calculating the electric currents, other than the electric current calculated by the second calculating process, flowing through the electronic apparatus due to the radio wave radiated by the antenna, by proportional operations, by using the electric current calculated by the second calculating process and a value of a wave source of the antenna at the frequency, from among the carrier wave frequency, upper sideband frequency and lower sideband frequency, for which the second calculating process calculated the above electric current and a value of a wave source of the antenna at the frequency other than the above frequency for which the second calculating process calculated the above electric current, and a fourth calculating process calculating the electric currents, other than the electric currents calculated by the second and third calculating process, flowing through the electronic apparatus due b the radio wave radiated by the antenna, by proportional operations, by using the electric current calculated by the third calculating process and a value of a wave source of the antenna at the frequency, from among the carrier wave frequency, upper sideband frequency and lower sideband frequency, for which the third calculating process calculated the above electric current end a value of a wave source of the antenna at the frequency other than the above frequency for which the third calculating process calculated the above electric current.

* * * * *

UNITED STATES PATENT AND TRADEMARK OFFICE
CERTIFICATE OF CORRECTION

PATENT NO. : 6,879,942 B1
DATED : April 12, 2005
INVENTOR(S) : Kenji Nagase et al.

It is certified that error appears in the above-identified patent and that said Letters Patent is hereby corrected as shown below:

<u>Title page,</u>
Item [56], References Cited, OTHER PUBLICATIONS,
"K. Homma," reference, insert -- " -- before "Frequency"; and insert -- " -- after "Analysis".
Item [57], ABSTRACT,
Line 6, insert -- , -- after "same".

<u>Column 24,</u>
Line 17, delete ";".

<u>Column 27,</u>
Line 48, delete ";".

<u>Column 29,</u>
Line 46, after "frequency," insert -- the upper sideband frequency --.
Line 50, change "Common" to -- common --.
Line 52, change "rowing" to -- flowing --.

<u>Column 30,</u>
Lines 8 and 11, change "end" to -- and --.

<u>Column 31,</u>
Line 18, change "26" to -- 20 --.

<u>Column 33,</u>
Lines 2 and 60, change "end" to -- and --.

<u>Column 39,</u>
Line 5, change "ran" to -- an --.

UNITED STATES PATENT AND TRADEMARK OFFICE
CERTIFICATE OF CORRECTION

PATENT NO. : 6,879,942 B1
DATED : April 12, 2005
INVENTOR(S) : Kenji Nagase et al.

It is certified that error appears in the above-identified patent and that said Letters Patent is hereby corrected as shown below:

Column 40,
Line 19, change "b" to -- to --.
Line 27, change "end" to -- and --.

Signed and Sealed this

Sixteenth Day of May, 2006

JON W. DUDAS
*Director of the United States Patent and Trademark Office*